(12) United States Patent
Watanabe et al.

(10) Patent No.: US 8,239,147 B2
(45) Date of Patent: Aug. 7, 2012

(54) TEST APPARATUS AND MANUFACTURING METHOD

(75) Inventors: Daisuke Watanabe, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 502 days.

(21) Appl. No.: 12/388,521

(22) Filed: Feb. 19, 2009

(65) Prior Publication Data

US 2010/0049453 A1 Feb. 25, 2010

Related U.S. Application Data

(63) Continuation of application No. PCT/JP2007/065869, filed on Aug. 14, 2007.

(51) Int. Cl.
*G01R 31/00* (2006.01)
*G01R 21/00* (2006.01)

(52) U.S. Cl. ............... 702/58; 702/59; 702/60; 702/189

(58) Field of Classification Search ............. 702/58–65, 702/121–123, 179–189
See application file for complete search history.

(56) References Cited

FOREIGN PATENT DOCUMENTS

| JP | 02-111126 | | 4/1990 |
|---|---|---|---|
| JP | 2002-111126 | * | 4/1990 |
| JP | 04-250373 | * | 9/1992 |
| JP | 6-69866 | * | 9/1994 |
| JP | 6-69866 | * | 9/1996 |
| JP | 2000-68816 | * | 3/2000 |
| JP | 2002-40112 | * | 2/2002 |
| JP | 2005-217999 | * | 8/2005 |
| JP | 06-025100 | * | 1/2006 |
| JP | 2006-025100 | | 1/2006 |
| JP | 2006-25100 | * | 1/2006 |

OTHER PUBLICATIONS

"Office Action of Korean Counterpart Application", issued on Sep. 29, 2011, p. 1-p. 7, with English translation thereof.
"Office Action of Korea Counterpart Application", issued on Apr. 29, 2012, with English translation thereof, p1-p7.

* cited by examiner

*Primary Examiner* — Phuong Huynh
(74) *Attorney, Agent, or Firm* — Jianq Chyun IP Office

(57) ABSTRACT

Provided is a test apparatus that tests a device under test, comprising a test signal generating section that generates a test signal to be applied to the device under test; a first driver that is electrically connected to a terminal of the device under test and that supplies the test signal to the terminal of the device under test; a correction signal generating section that generates a correction signal for correcting attenuation of the test signal occurring until the test signal reaches the terminal of the device under test; and a second driver that is electrically connected to the terminal of the device under test and that supplies the correction signal to the terminal of the device under test.

7 Claims, 21 Drawing Sheets

TEST APPARATUS AND MANUFACTURING METHOD

CROSS REFERENCE TO RELATED APPLICATION

This is a continuation application of PCT/JP2007/65869 filed on Aug. 14, 2007 which claims priority from a Non-provisional patent application Ser. No. 11/509,307 filed on Aug. 24, 2006, the contents of which are incorporated herein by reference.

BACKGROUND

1. Technical Field

The present invention relates to a test apparatus. In particular, the present invention relates to a test apparatus provided with a correction signal generating section that generates a correction signal for compensating loss of a test signal applied to a device under test, and to a method for manufacturing a device that uses the test apparatus.

2. Related Art

When conventionally testing a device under test such as a semiconductor circuit, the acceptability of the device under test is judged by applying a prescribed test signal to the device under test and measuring a response signal output by the device under test. For example, a test is performed to determine whether the device under test is operating normally by judging whether a logic pattern of the response signal output by the device under test supplied with the test signal having a prescribed test pattern matches an expected value pattern.

When performing such a test, the test apparatus applies the prescribed signal to the device under test. If the signal is attenuated in the transmission path from the test apparatus to the device under test, however, the logic pattern of the test signal to be applied to the device under test is sometimes different from the actual logic pattern of the test signal applied to the device under test.

To solve this problem, a test apparatus is known that corrects the waveform of the test signal in advance according to the attenuation of the test signal in the transmission path. Japanese Patent Application Publication No. 2002-40112, for example, discloses a test apparatus that can generate the test signal to have emphasized edge portions by generating a plurality of pulse signals having different pulse widths, with the edge timing of the test signal as a reference, and adding the waveforms of these pulse signals to the waveform of the test signal.

This test apparatus, however, is provided with a register storing the pulse width and amplitude of the correction signal for correcting in advance the waveform of the test signal, and with a calculating apparatus that obtains the pulse width and amplitude of the correction signal for correcting the waveform of the test signal based on digital data of the waveform of the signal resulting from the test signal applied to the device under test being reflected at the end of the transmission line. Not only does this result in a complicated circuit configuration, but also necessitates changing the settings of the register and the calculating apparatus when a test signal with a different waveform is applied to the device under test.

SUMMARY

Therefore, it is an object of an aspect of the innovations herein to provide a test apparatus and a method for manufacturing a device using the test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a test signal generating section that generates a test signal to be applied to the device under test; a first driver that is electrically connected to a terminal of the device under test and that supplies the test signal to the terminal of the device under test; a correction signal generating section that generates a correction signal for correcting attenuation of the test signal occurring until the test signal reaches the terminal of the device under test; and a second driver that is electrically connected to the terminal of the device under test and that supplies the correction signal to the terminal of the device under test.

According to a second aspect related to the innovations herein, one exemplary test apparatus may include a test apparatus that tests a device under test, comprising a comparator that is electrically connected to a terminal of the device under test, and that detects a logic value of a response signal from the device under test; a correction signal generating section that generates a correction signal for correcting attenuation of the response signal occurring while the response signal travels from the terminal of the device under test to the comparator; and a driver that supplies the generated correction signal to the comparator.

According to a third aspect related to the innovations herein, one exemplary manufacturing method may include a method for manufacturing a device, comprising manufacturing the device; and selecting the device by testing the device using a test apparatus. The test apparatus includes a test signal generating section that generates a test signal to be applied to the device under test; a first driver that is electrically connected to a terminal of the device under test and that supplies the test signal to the terminal of the device under test; a correction signal generating section that generates a correction signal for correcting attenuation of the test signal occurring until the test signal reaches the terminal of the device under test; and a second driver that is electrically connected to the terminal of the device under test and that supplies the correction signal to the terminal of the device under test.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
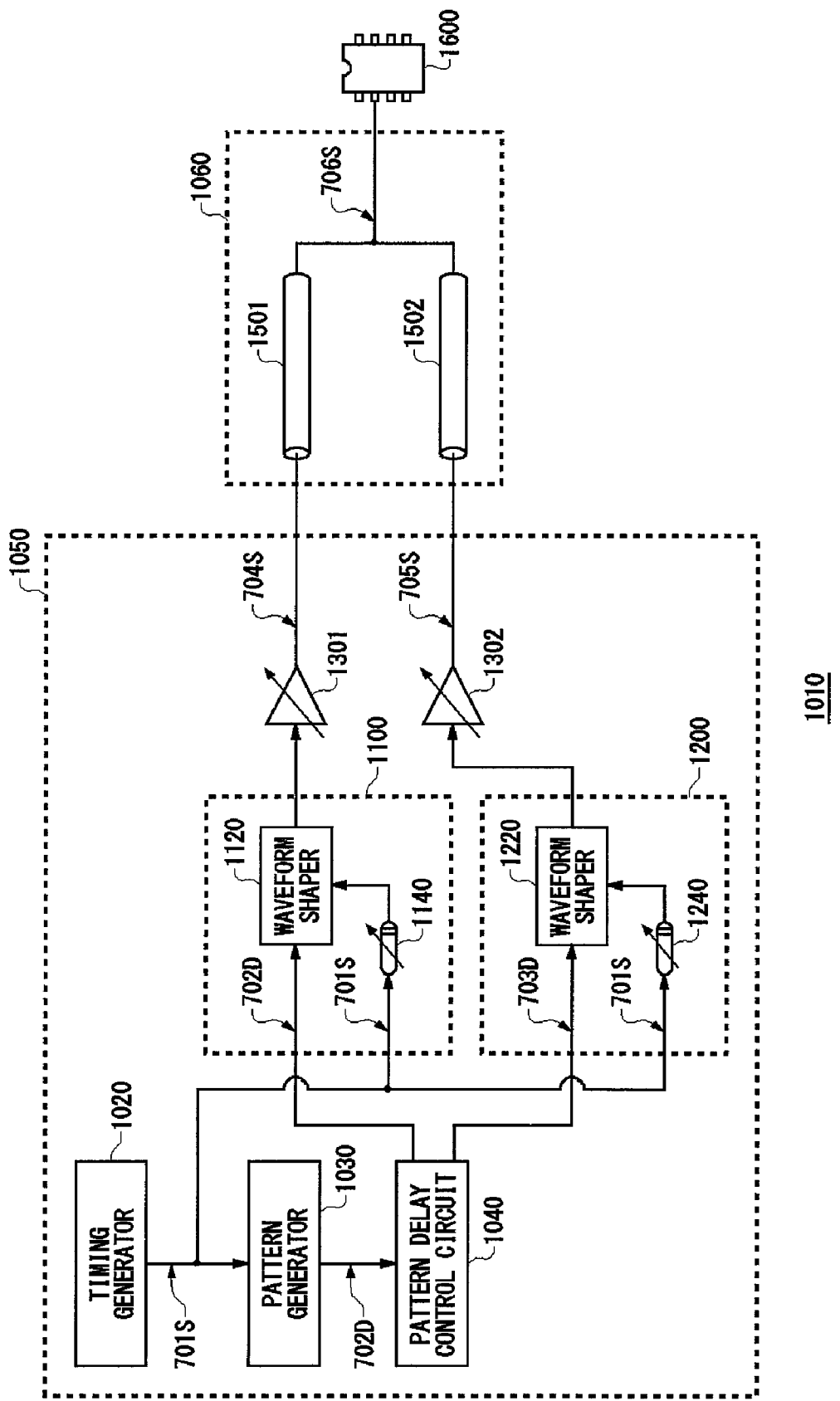
FIG. 1 shows an exemplary configuration of a test apparatus 1010 according to an embodiment of the present invention.
Figure 2:
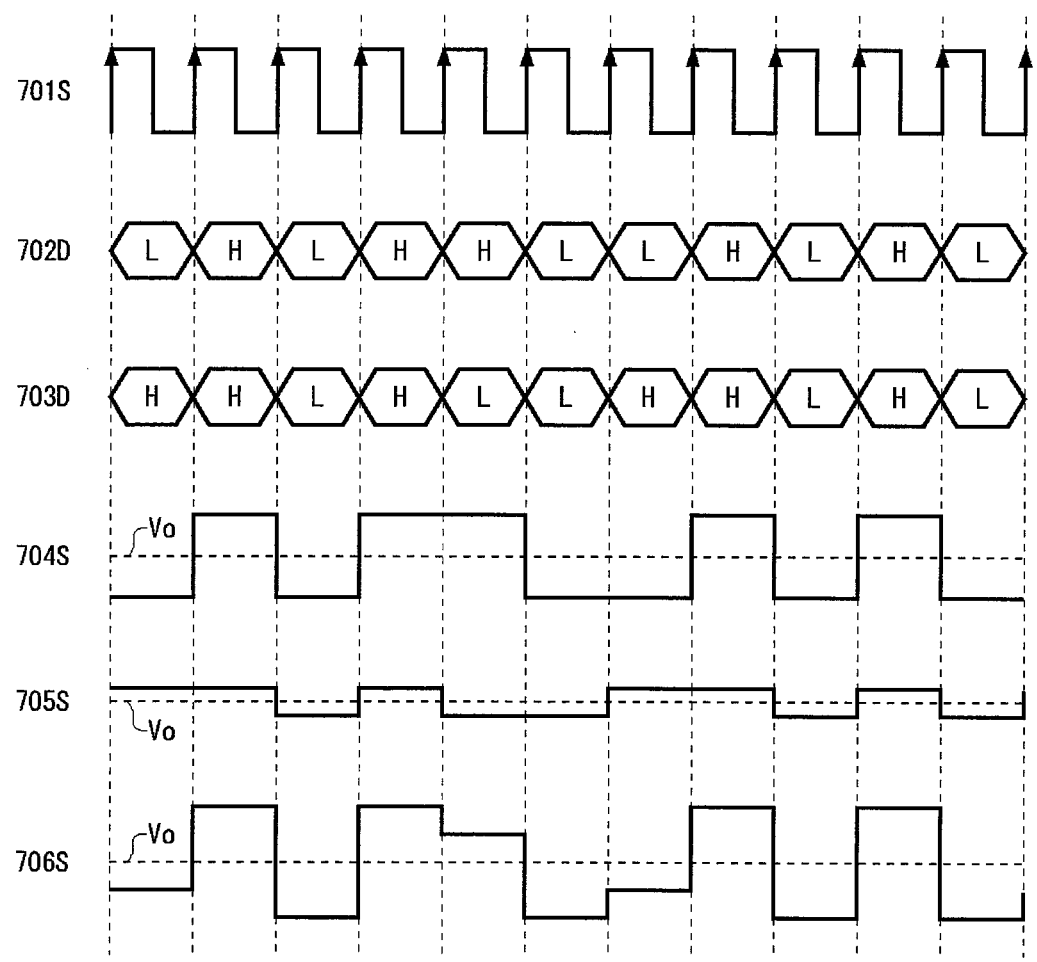
FIG. 2 is a timing chart showing an exemplary operation of the test apparatus 1010.

FIG. 1 shows an exemplary configuration of a test apparatus 1010 according to an embodiment of the present invention. FIG. 2 is a timing chart showing an exemplary operation of the test apparatus 1010. The test apparatus 1010 tests a device under test 1600 such as an IC or an LSI, and is provided with a test head 1050 and a device interface section 1060. The test head 1050 includes a timing generator 1020, a pattern generator 1030, a pattern delay control circuit 1040, a test signal generating section 1100, a correction signal generating section 1200, a first driver 1301, and a second driver 1302. The device interface section 1060 provides an electrical connection between the first driver 1301 and a terminal of the device under test 1600 using a signal line that includes a coaxial cable 1501, and provides an electrical connection between the second driver 1302 and the same terminal of the device under test 1600 using a signal line that includes a coaxial cable 1502. The device interface section 1060 may instead provide the electrical connection between the first driver 1301 and the terminal of the device under test 1600 and between the second driver 1302 and the terminal of the device under test 1600 using a signal line such as a microstrip line, which does not include the coaxial cables 1501 and 1502.

The test apparatus 1010 may judge the acceptability of the device under test 1600 by (i) applying, to the device under test 1600, a test signal 706S obtained by combining a test signal 704S generated based on a prescribed test pattern 702D and a correction signal 705S generated based on a correction pattern 703D generated from the test pattern 702D and (ii) comparing a logic pattern of a response signal from the device under test 1600 to an expected value pattern corresponding to the test pattern 702D. In the test apparatus 1010 shown in FIG. 1, the configuration of the section that judges the acceptability of the device under test 1600 based on the response signal from the device under test 1600 is not shown.

The timing generator 1020 is a circuit that generates a cyclical signal 701S for generating the test pattern 702D. The cyclical signal 701S has a specific repeating cycle, as shown in FIG. 2. Upon receiving the cyclical signal 701S generated by the timing generator 1020, the pattern generator 1030 generates the test pattern 702D based on the cyclical signal 701, and sends the test pattern 702D to the pattern delay control circuit 1040. The test pattern 702D is a logic pattern with a prescribed arrangement of logic H and logic L, and includes pattern data that is to be contained in the test signal 704S that is supplied to the device under test 1600 to test the device under test 1600. The pattern delay control circuit 1040 sends the test pattern 702D sent from the pattern generator 1030 to the waveform shaper 1120 of the test signal generating section 1100, described below, without altering the signal. The pattern delay control circuit 1040 also generates the correction pattern 703D, which is a logic pattern obtained by delaying the test pattern 702D by one bit and inverting the delayed test pattern 702D, and sends the correction pattern 703D to the waveform shaper 1220 of the correction signal generating section 1200, described below.

The test signal generating section 1100 includes the waveform shaper 1120 and a variable delay circuit 1140, and generates the test signal 704S applied to the device under test 1600. The waveform shaper 1120 generates the test signal 704S based on the test pattern 702D sent from the pattern delay control circuit 1040. The variable delay circuit 1140 delays the test signal 704S generated by the waveform shaper 1120 by an amount set in advance according to the test pattern 702D. The test signal generating section 1100 sends the generated test signal 704S to the first driver 1301. The first driver 1301 supplies the test signal 704S received from the test signal generating section 1100 to the terminal of the device under test 1600 via the signal line that includes the coaxial cable 1501 of the device interface section 1060. Here, the test signal 704S is a pulse signal having a voltage level that corresponds to the logic value of each bit of the test pattern 702D. For example, for each prescribed period, e.g. each unit cycle, the test signal 704S takes a voltage value that corresponds to each logic H and logic L of the test pattern 702D centered on a reference voltage value of zero, as shown in FIG. 2.

The correction signal generating section 1200 includes a waveform shaper 1220 and a variable delay circuit 1240. The correction signal generating section 1200 generates the correction signal 705S that compensates for the attenuation of the test signal 704S that occurs until the test signal 704S reaches the terminal of the device under test 1600. The waveform shaper 1220 generates the correction signal 705S based on the correction pattern 703D sent by the pattern delay control circuit 1040. The variable delay circuit 1240 delays the correction signal 705S generated by the waveform shaper 1220 by an amount set in advance according to the correction pattern 703D. The correction signal generating section 1200 sends the generated correction signal 705S to the second driver 1302. The second driver 1302 supplies the correction signal 705S received from the correction signal generating section 1200 to the same terminal of the device under test 1600 that received the test signal 704S from the first driver 1301, via the signal line that includes the coaxial cable 1502 of the device interface section 1060. In the test apparatus 1010 of the present embodiment, instead of being generated by the test head 1050 and supplied to the terminal of the device under test 1600 along with the test signal 704S, the correction signal 705S may be generated in advance based on the test pattern 702D and supplied directly to the terminal of the device under test 1600.

The correction signal 705S is a pulse signal generated based on the correction pattern 703D, which is generated from the test pattern 702D by the pattern delay control circuit 1040, as described above. The correction signal 705S has a voltage level that corresponds to the logic value of each bit of the correction pattern 703D. For example, for each unit cycle that is the same as that of the test signal 704S, the correction signal 705S takes a voltage value that corresponds to each logic H and logic L of the correction pattern 703D centered on a reference voltage value of zero, as shown in FIG. 2. Here, the amplitude of the correction signal 705S relative to the reference voltage is smaller than the amplitude of the test signal 704S relative to the reference voltage. From the above, it is understood that the correction signal 705S is a pulse signal obtained by delaying the test signal 704S by one cycle and then inverting the delayed test signal 704S, and therefore the correction signal 705S has an amplitude, i.e. a voltage level centered on the reference voltage, that is smaller than that of the test signal 704S.

The test signal 704S and the correction signal 705S are combined at the terminal of the device under test 1600, and the resulting test signal 706S is supplied from the terminal to the device under test 1600. In comparison to the test signal 704S, the test signal 706S has a waveform in which each rising edge and falling edge is emphasized by the correction signal 705S.

In this way, even when the change in the voltage level between each pulse in the test signal 704S becomes very small due to attenuation, particularly at the rising edges and falling edges, that occurs while the test signal 704S travels from the first driver 1301 to the terminal of the device under test 1600, the test apparatus 1010 of the present embodiment can use the correction signal 705S to emphasize the rising and falling edges of the pulses. Accordingly, bit errors are less likely to occur at the device under test 1600 side, thereby enabling accurate testing of the device under test 1600.

Since the amplitude of each pulse in the correction signal 705S is smaller than the amplitude of each pulse in the test signal 704S, as described above, when combining the test signal 704S and the correction signal 705S, even if a portion corresponding to logic H in the correction signal 705S is superimposed on a portion corresponding to logic L in the test signal 704S or a portion corresponding to logic L in the correction signal 705S is superimposed on a portion corresponding to logic H in the test signal 704S, bit errors at the device under test 1600 side can be prevented.

Figure 3:
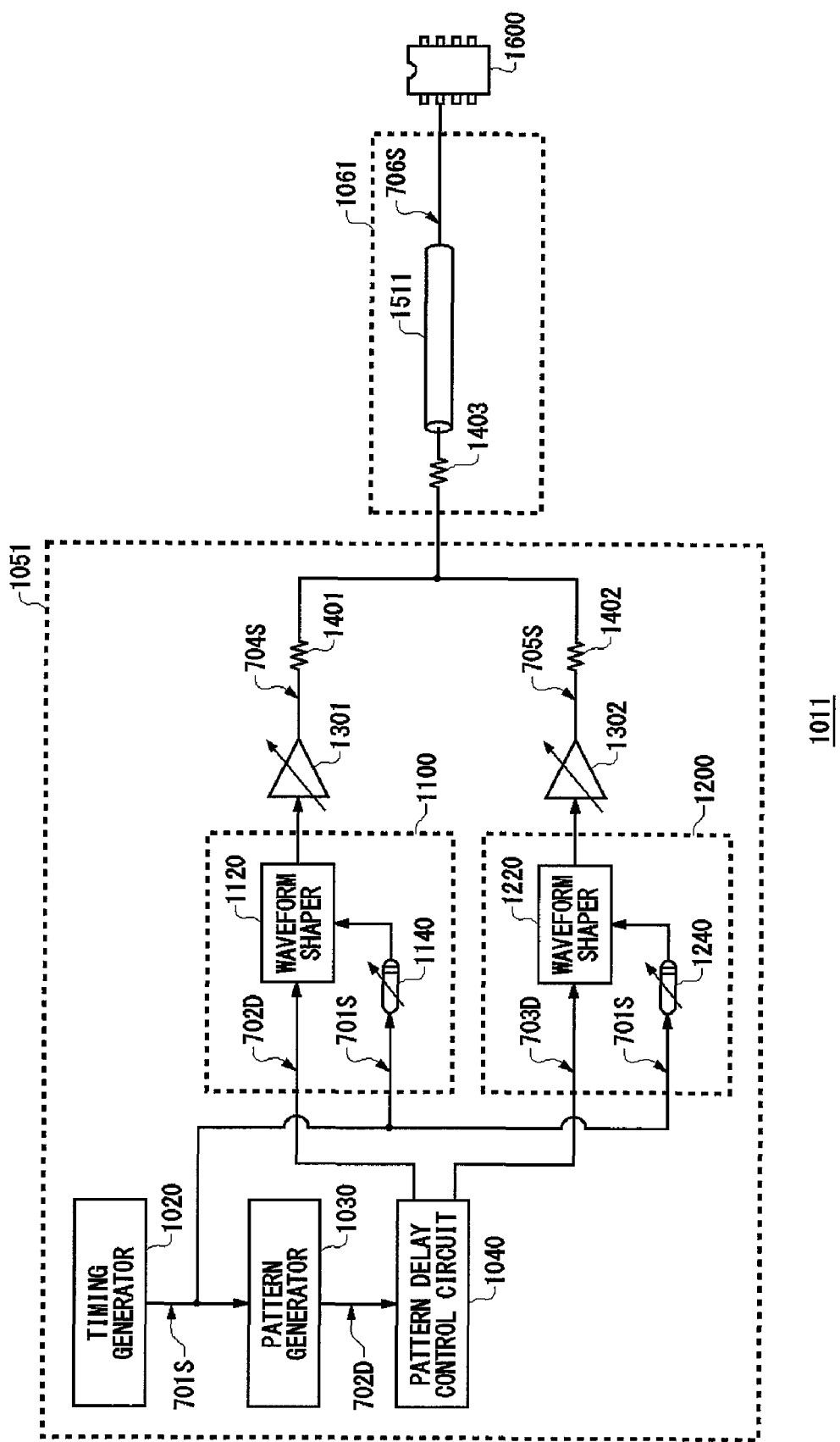
FIG. 3 shows an exemplary configuration of a test apparatus 1011 according to a modification of the present embodiment.

FIG. 3 shows an exemplary configuration of a test apparatus 1011 according to a modification of the present embodiment. The components of the test apparatus 1011 shown in FIG. 3 are given the same reference numerals as identical components in the test apparatus 1010, and further description is omitted. The test apparatus 1011 is provided with a test head 1051 and a device interface section 1061. In the test apparatus 1011, the transmission paths on the output side of the first driver 1301 and the output side of the second driver 1302 are connected to a single signal line extending from the device interface section 1061 to the test head 1051. The device interface section 1061 includes the signal line having the coaxial cable 1511, and this signal line provides an electrical connection between (i) the first driver 1301 and the second driver 1302 and (ii) the terminal of the device under test 1600. The device interface section 1061 may instead use a signal line that does not include the coaxial cable 1511, such as a microstrip line, to provide the electrical connection between (i) the first driver 1301 and the second driver 1302 and (ii) the terminal of the device under test 1600.

A cable serial resistor 1403 is provided in series with the coaxial cable 1511 at the end of the coaxial cable 1511 on the side of the drivers. A first driver serial resistor 1401 is provided between the first driver 1301 and the driver-side end of the cable serial resistor 1403. A second driver serial resistor 1402 is provided between the second driver 1302 and the driver-side end of the cable serial resistor 1403. Here, the resistance value for each of the first driver serial resistor 1401, the second driver serial resistor 1402, and the cable serial resistor 1403 is desirably set such that (i) the impedance of the coaxial cable 1511 as seen from the device under test 1600 is equal to (ii) the combined impedance of the first driver serial resistor 1401, the second driver serial resistor 1402, and the cable serial resistor 1403. If the connection between (i) the first driver 1301 and the second driver 1302 and (ii) the terminal of the device under test 1600 is provided by a signal line that does not include the coaxial cable 1511, the impedance of the signal line between the cable serial resistor 1403 and the terminal of the device under test 1600 is desirably set to be equal to the combined impedance of the first driver serial resistor 1401, the second driver serial resistor 1402, and the cable serial resistor 1403.

Here, since the correction signal 705S has an amplitude relative to the reference voltage less than that of the test signal 704S, as described above, the signal line noise or the like might be attenuated to the same level in the test apparatus 1010 while being transmitted on the coaxial cable 1502. In this case, it becomes difficult to detect the pulse of the correction signal 705S, such that it is difficult to combine the correction signal 705S with the test signal 704S. To solve this problem, the correction signal 705S output from the second driver 1302 in the test apparatus 1011 is combined with the test signal 704S before being transmitted on the coaxial cable 1511. Accordingly, the test apparatus 1011 can generate a more suitable test signal 706S in which the rising and falling edges of the test signal 704S are emphasized by correcting the attenuation of the test signal 704S with the correction signal 705S.

Figure 4:
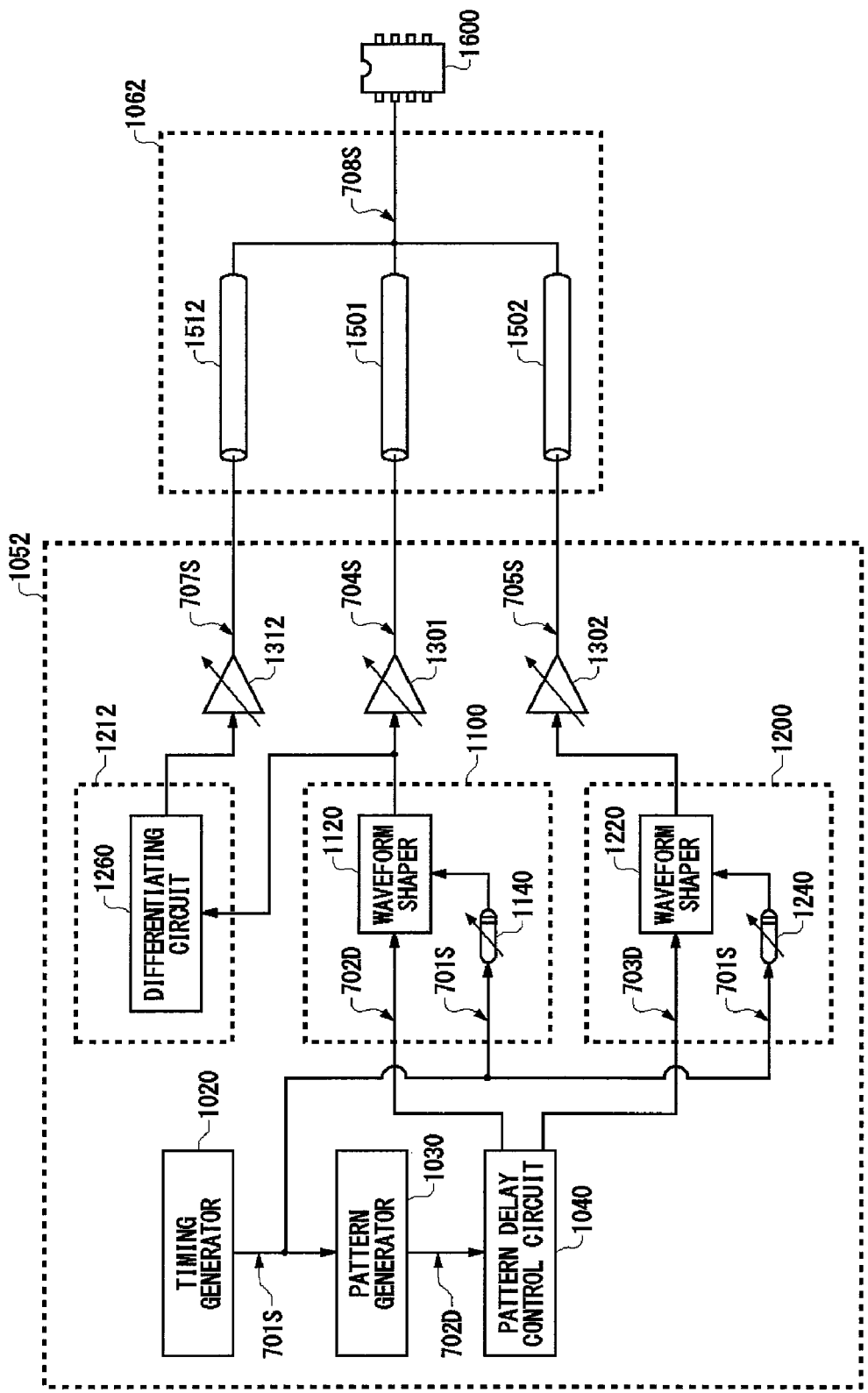
FIG. 4 shows an exemplary configuration of a test apparatus 1012 according to another modification of the present embodiment.
Figure 5:
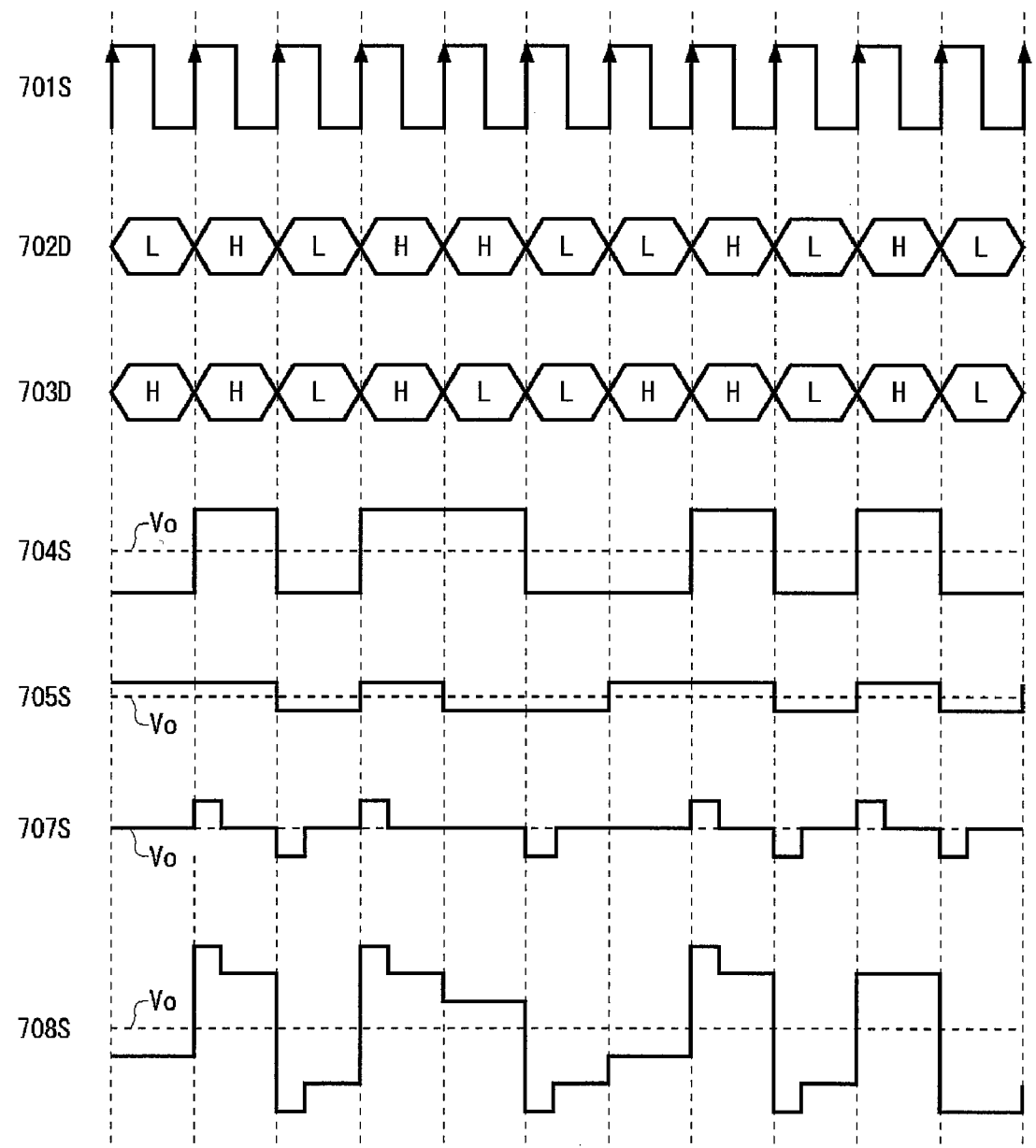
FIG. 5 is a timing chart showing an exemplary operation of the test apparatus 1012.

FIG. 4 shows an exemplary configuration of a test apparatus 1012 according to another modification of the present embodiment. FIG. 5 is a timing chart showing an exemplary operation of the test apparatus 1012. In the timing chart and the configuration of the test apparatus 1012 shown in FIGS. 4 and 5, components that are the same as those of the test apparatus 1010 are given the same reference numeral, and further description is omitted. The test apparatus 1012 is provided with a test head 1052 and a device interface section 1062. In addition to the configuration of the test head 1050 described above, the test head 1052 further includes a correction signal generating section 1212 and a third driver 1312. In addition to the configuration of the device interface section 1060 in the test apparatus 1010 described above, the device interface section 1062 further includes a signal line containing a coaxial cable 1512. This signal line provides an electrical connection between the third driver 1312 and the terminal of the device under test 1600. The device interface section 1062 may instead use a signal line that does not include the coaxial cable 1512, such as a microstrip line, to provide the electrical connection between the third driver 1312 and the terminal of the device under test 1600.

The correction signal generating section 1212 includes a differentiating circuit 1260 that generates a signal by differentiating the pulse waveform of the supplied signal. The differentiating circuit 1260 generates the correction signal 707S by differentiating the test signal 704S output by the waveform shaper 1120, and sends the generated correction signal 707S to the third driver 1312. The third driver 1312 supplies the correction signal 707S received from the differentiating circuit 1260 to the same terminal of the device under test 1600 that the first driver 1301 and the second driver 1302 are connected to, via the signal line of the device interface section 1062 including the coaxial cable 1512.

Accordingly, the correction signal 707S generated by the differentiating circuit 1260 of the correction signal generating section 1212 is combined with the test signal 704S and the correction signal 705S at the terminal of the device under test 1600. By combining the test signal 704S with the correction signal 705S and the correction signal 707S, the device under test 1600 can be supplied with a test signal 708S in which the rising edges and falling edges of the pulses are further emphasized.

In this way, even when the change in the voltage level between each pulse in the test signal 704S becomes very small due to attenuation, particularly at the rising edges and falling edges, that occurs while the test signal 704S travels from the first driver 1301 to the terminal of the device under test 1600, the test apparatus 1012 of the present modification can use the correction signal 705S and the correction signal 707S to emphasize the rising and falling edges of the pulses. Accordingly, bit errors are less likely to occur at the device under test 1600 side, thereby enabling accurate testing of the device under test 1600.

Furthermore, whether the amplitude of each pulse in the correction signal 707S is a pulse with a high voltage level relative to the reference voltage or a pulse with a low voltage level relative to the reference voltage depends on whether the pulse in the same cycle of the test signal 704S has a rising edge or a falling edge. Accordingly, when combining the test signal 704S and the correction signal 707S, the test apparatus 1012 prevents (i) a portion of the correction signal 707S with a voltage level higher than the reference voltage from being superimposed on a portion of the test signal 704S with a voltage level lower than the reference voltage such that the voltage level of this portion of the test signal 704S becomes higher than the reference voltage and (ii) a portion of the correction signal 707S with a voltage level lower than the reference voltage from being superimposed on a portion of the test signal 704S with a voltage level higher than the reference voltage such that the voltage level of this portion of the test signal 704S becomes lower than the reference voltage.

Figure 6:
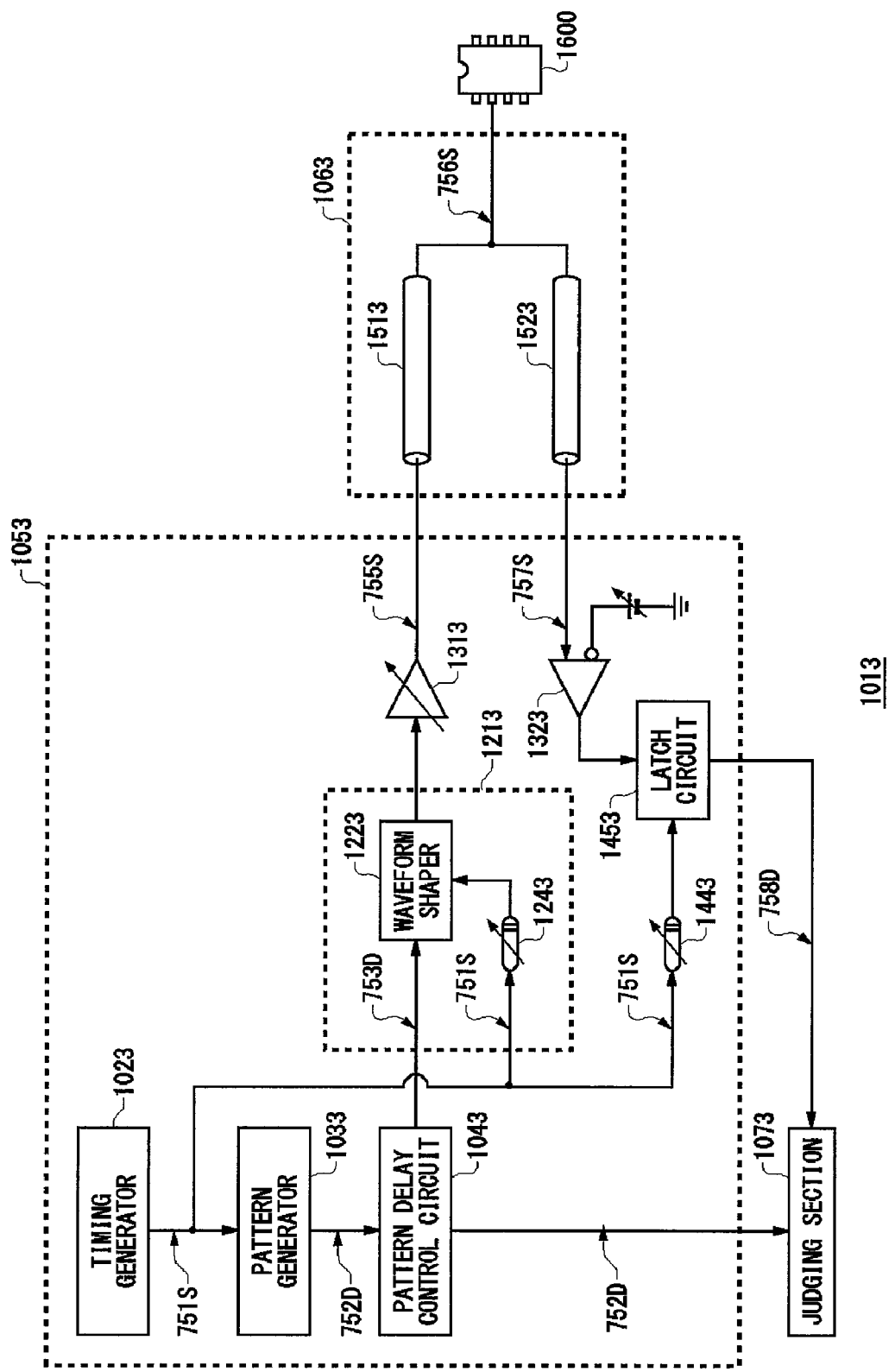
FIG. 6 shows an exemplary configuration of a test apparatus 1013 according to another modification of the present embodiment.
Figure 7:
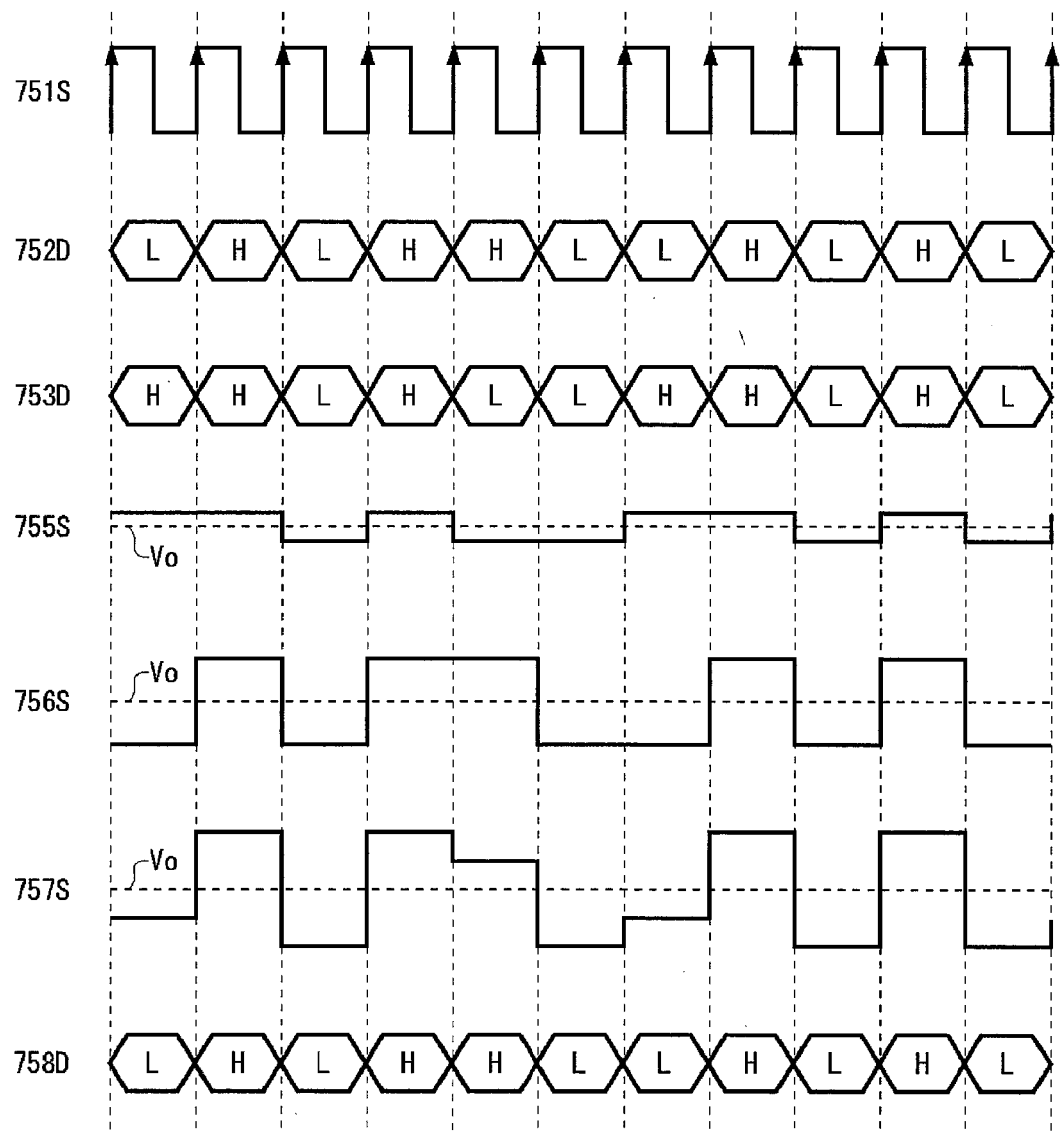
FIG. 7 is a timing chart showing an exemplary operation of the test apparatus 1013.

FIG. 6 shows an exemplary configuration of a test apparatus 1013 according to another modification of the present embodiment. FIG. 7 is a timing chart showing an exemplary operation of the test apparatus 1013. As shown in FIG. 6, the test apparatus 1013 includes a test head 1053, a device interface section 1063, and a judging section 1073. The test head 1053 includes a timing generator 1023, an expected value pattern generator 1033, a pattern delay control circuit 1043, a correction signal generating section 1213, a driver 1313, a comparator 1323, a variable delay circuit 1443, and a latch circuit 1453. The device interface section 1063 provides an electrical connection between the driver 1313 and the terminal of the device under test 1600 using a signal line that includes a coaxial cable 1513, and provides an electrical connection between the comparator 1323 and the terminal of the device under test 1600 using a signal line that includes a coaxial cable 1523. The device interface section 1063 may instead provide the electrical connection between the driver 1313 and the terminal of the device under test 1600 and between the comparator 1323 and the terminal of the device under test 1600 using a signal line such as a microstrip line, which does not include the coaxial cables 1513 and 1523.

The test apparatus 1013 may apply, to the device under test 1600, the test signal generated based on a prescribed test pattern. The test apparatus 1013 generates a response signal 757S by combining (i) a response signal 756S output by the device under test 1600 in response to the test signal and (ii) a correction signal 755S generated based on a correction pattern 753D, which is generated from an expected value pattern 752D corresponding to the test pattern. The test apparatus 1013 may then judge the acceptability of the device under test 1600 by comparing the logic pattern of the response signal 757S to the expected value pattern 752D. In the test apparatus 1013 shown in FIG. 6, the configuration relating to the section for applying the test signal to the device under test 1600 is not described.

The timing generator 1023 is a circuit that generates a cyclical signal 751S for generating the expected value pattern 752D. The cyclical signal 751S has a prescribed repeating cycle, as shown in FIG. 7. Upon receiving the cyclical signal 751S generated by the timing generator 1023, the expected value pattern generator 1033 generates the expected value pattern 752D based on the cyclical signal 751S and sends the expected value pattern 752D to the pattern delay control circuit 1043. The expected value pattern 752D corresponds to the above test pattern, and is a logic pattern in which logic H and logic L are in the same arrangement as in the test pattern. The pattern delay control circuit 1043 sends the expected value pattern 752D unaltered to the judging section 1073, and also delays the expected value pattern 752D by one bit to generate the correction pattern 753, which is the inverted logic pattern, and sends the correction pattern 753D to a waveform shaper 1223 of the correction signal generating section 1213, described below.

The correction signal generating section 1213 includes the waveform shaper 1223 and a variable delay circuit 1243. The correction signal generating section 1213 generates the correction signal 755S that compensates for the waveform attenuation of the response signal 756S occurring when the response signal 756S travels from the terminal of the device under test 1600 to the comparator 1323. The waveform shaper 1223 generates the correction signal 755S based on the correction pattern 753D received from the pattern delay control circuit 1043. The variable delay circuit 1243 delays the correction signal 755S generated by the waveform shaper 1223 by a preset amount corresponding to the correction pattern 753D. The correction signal generating section 1213 sends the generated correction signal 755S to the driver 1313. The driver 1313 supplies the correction signal 755S received from the correction signal generating section 1213 to the transmission path between the comparator 1323 and the terminal of the device under test 1600 that output the response signal 756S, via the signal line including the coaxial cable 1513 in the device interface section 1063. For example, the driver 1313 supplies the correction signal 755S to a terminal-side end of the signal line that includes the coaxial cable 1523 providing the connection between the comparator 1323 and the terminal of the device under test 1600 that output the response signal 756S. The driver 1313 may instead supply the correction signal 755S to the comparator-side end of the signal line including the coaxial cable 1523.

The correction signal 755S is a pulse signal generated based on the correction pattern 753D, which is generated from the expected value pattern 752D by the pattern delay control circuit 1043, as described above. The correction signal 755S has a voltage level corresponding to each logic value of the correction pattern 753D. As shown in FIG. 7, while centered on a reference voltage value of zero, the correction signal 755S may take a voltage value that is greater than the reference voltage by a certain amount when the correction pattern 753D is logic H, and may take a voltage value that is less than the reference voltage by a certain amount when the correction pattern 753D is logic L. The amplitude of the correction signal 755S relative to the reference voltage is smaller than the amplitude of the response signal 756S relative to the reference voltage. From the above, it is understood that the correction signal 755S is a pulse signal obtained by delaying the response signal 756S by one cycle and then inverting the delayed response signal 756S, and therefore the correction signal 755S has an amplitude, i.e. a voltage level centered on the reference voltage, that is smaller than that of the response signal 756S.

The response signal 756S and the correction signal 755S are combined near the terminal of the device under test 1600, for example, to form the response signal 757S having a waveform such as that shown in FIG. 2. The response signal 757S is supplied to the comparator 1323 via the signal line including the coaxial cable 1523 in the device interface section 1063. Upon receiving the response signal 757S, the comparator 1323 detects the logic value of the response signal 757S. The latch circuit 1453 acquires the logic value of the response signal 757S detected by the comparator 1323, at the edge timings of the cyclical signal 751S supplied thereto, and sends the acquired logic values to the judging section 1073 as the response signal pattern 758D. Here, the cyclical signal 751S supplied to the latch circuit 1453 is delayed by the variable delay circuit 1443 by a preset amount. The judging section 1073 determines whether the logic values of the response signal 757S match the logic values of the expected value pattern 752D, based on the expected value pattern 752D received from the expected value pattern generator 1033 and the response signal patterns 758 received from the latch circuit 1453.

In the test apparatus 1013 described above, the response signal 756S and the correction signal 755S are combined near the terminal of the device under test 1600, and the resulting response signal 757S having the waveform shown in FIG. 7 is supplied to the comparator 1323. Accordingly, the correction signal 755S corrects the voltage level attenuation of the response signal 756S occurring when the response signal 756S travels from the terminal of the device under test 1600 to the comparator 1323. In this way, even when the change in the voltage level between each pulse in the test signal becomes very small due to attenuation that occurs while the response signal 756S travels from the terminal of the device under test 1600 to the comparator 1323, the test apparatus 1013 of the present modification can use the correction signal 755S to emphasize the rising and falling edges. Therefore, the test apparatus 1013 can accurately detect the logic values of the response signal 757S using the comparator 1323.

Since the amplitude of each pulse in the correction signal 755S is smaller than the amplitude of each pulse in the response signal 756S, as described above, when combining the response signal 756S and the correction signal 755S, even if a portion corresponding to logic H in the correction signal 755S is superimposed on a portion corresponding to logic L in the response signal 756S and a portion corresponding to logic L in the correction signal 755S is superimposed on a portion corresponding to logic H in the response signal 756S, the comparator 1323 correctly detect the logic value of the response signal 757S corresponding to the response signal 756S.

In the same manner as in the test apparatus 1012, the test head 1053 in the test apparatus 1013 may include the third driver 1312 and the correction signal generating section 1212 containing the differentiating circuit 1260, and the device interface section 1063 may further include the signal line containing the coaxial cable 1512. In this case, the differentiating circuit 1260 generates the correction signal by differentiating the correction signal 755S output by the waveform shaper 1223 and sends the correction signal to the third driver 1312. The third driver 1312 supplies the correction signal received from the differentiating circuit 1260 to the terminal of the device under test 1600 that outputs the response signal 756S, via the signal line including the coaxial cable 1512 of the device interface section 1063.

Accordingly, the correction signal generated by the differentiating circuit 1260 of the correction signal generating section 1212 is combined with the response signal 756S and the correction signal 755S near the terminal of the device under test 1600. Therefore, the response signal 756S from the device under test 1600 has a waveform in which the rising and falling edges of the pulses are emphasized by the combination with the correction signal 755S and again by the combination with the correction signal obtained by differentiating the correction signal 755S. As a result, the comparator 1323 can more accurately detect the response signal 757S.

Figure 8:
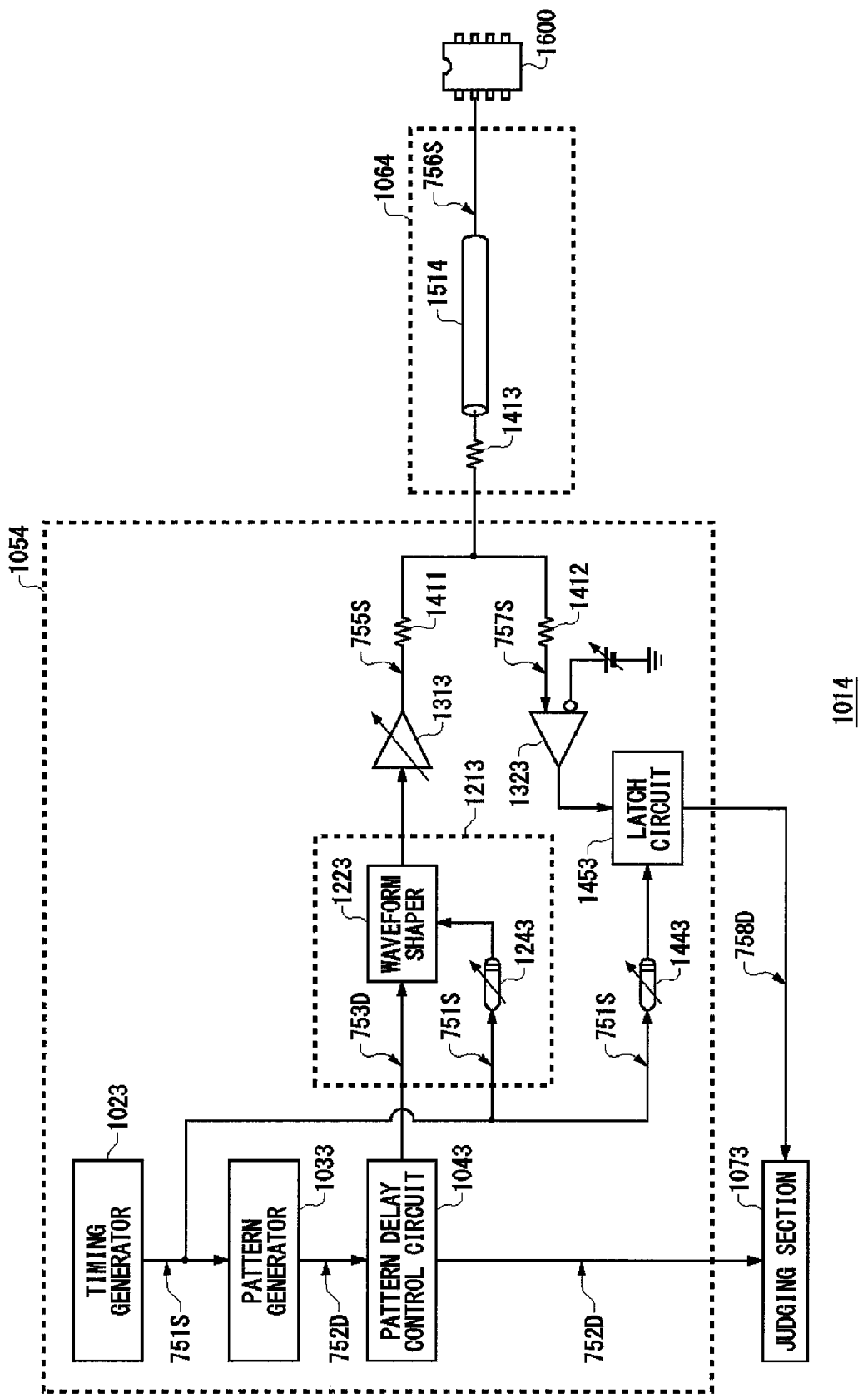
FIG. 8 shows an exemplary configuration of a test apparatus 1014 according to another modification of the present embodiment.

FIG. 8 shows an exemplary configuration of a test apparatus 1014 according to another modification of the present embodiment. In the configuration of the test apparatus 1014 shown in FIG. 8, components that are the same as those of the test apparatus 1013 are given the same reference numeral, and further description is omitted. The test apparatus 1014 is provided with a test head 1054 and a device interface section 1064. In the test apparatus 1014, the output side of the driver 1313 and the input side of the comparator 1323 are connected to each other by a single signal line in the test head 1054. The device interface section 1064 provides an electrical connection between this signal line and the terminal of the device under test 1600 using a signal line including a coaxial cable 1514. The device interface section 1064 may instead provide the electrical connection between (i) the driver 1313 and the comparator 1323 and (ii) the terminal of the device under test 1600 using a signal line such as a microstrip line, which does not include the coaxial cable 1514.

A cable serial resistor 1413 is provided serially with the coaxial cable 1514 at a driver-side end of the coaxial cable 1514. A first driver serial resistor 1411 is provided between the driver 1313 and the driver-side end of the cable serial resistor 1403. A second driver serial resistor 1412 is provided between the comparator 1323 and the driver-side end of the cable serial resistor 1403. Here, the resistance value for each of the first driver serial resistor 1411, the second driver serial resistor 1412, and the cable serial resistor 1403 is desirably set such that (i) the impedance of the coaxial cable 1514 as seen from the device under test 1600 is equal to (ii) the combined impedance of the first driver serial resistor 1411, the second driver serial resistor 1412, and the cable serial resistor 1413. If the connection between (i) the driver 1313 and the comparator 1323 and (ii) the terminal of the device under test 1600 is provided by a signal line that does not include the coaxial cable 1514, the impedance of the signal line between the cable serial resistor 1413 and the terminal of the device under test 1600 is desirably set to be equal to the combined impedance of the first driver serial resistor 1411, the second driver serial resistor 1412, and the cable serial resistor 1413.

Here, since the correction signal 755S has an amplitude relative to the reference voltage less than that of the response signal 756S, as described above, the signal line noise or the like might be attenuated to the same level in the test apparatus 1013 while being transmitted on the coaxial cable 1514. In this case, it becomes difficult to detect the pulse of the correction signal 755S, such that it is difficult to combine the correction signal 755S with the test signal 704S. To solve this problem, the correction signal 755S output from the driver 1313 in the test apparatus 1014 is combined with the response signal 756S by the test head 1054 without being transmitted on the signal line including the coaxial cable. Accordingly, the test apparatus 1014 can generate a more suitable response signal 757S in which the rising and falling edges of the response signal 756S are emphasized by correcting the attenuation of the response signal 756S with the correction signal 755S.

In the same manner as in the test apparatus 1012, the test head 1054 in the test apparatus 1014 may include the third driver 1312 and the correction signal generating section 1212 containing the differentiating circuit 1260. In this case, the differentiating circuit 1260 generates the correction signal by differentiating the correction signal 755S output by the waveform shaper 1223 and sends the correction signal to the third driver 1312. The third driver 1312 combines the correction signal received from the differentiating circuit 1260 with the correction signal 755S and the response signal 756S in the test head 1054. By providing the correction signal generating section 1212 and the third driver 1312 in this way, the test apparatus 1014 can combine the response signal 756S from the device under test 1600 with the correction signal 755S and again with the correction signal obtained by differentiating the correction signal 755S. Therefore, the comparator 1323 can detect the response signal 757S in which the rising and falling edges of the pulses are emphasized, thereby increasing the detection accuracy.

Figure 9:
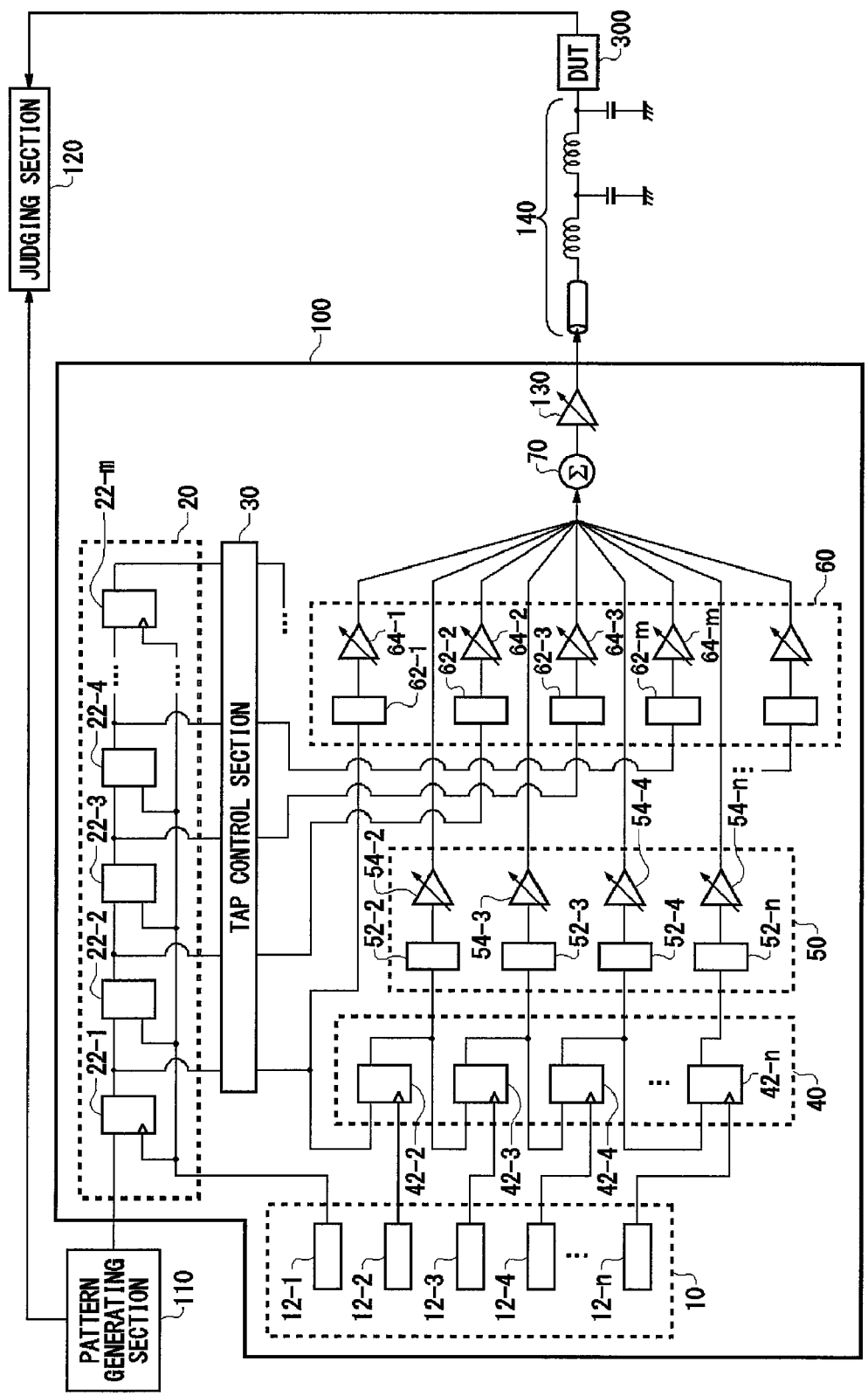
FIG. 9 shows an exemplary configuration of a test apparatus 200 according to another modification of the present embodiment.

FIG. 9 shows an exemplary configuration of a test apparatus 200 according to another modification of the present embodiment. The test apparatus 200 tests a device under test 300 such as a semiconductor circuit. For example, the test apparatus 200 judges the acceptability of the device under test 300 by inputting a signal having a prescribed test pattern to the device under test 300 and comparing a test pattern of a signal output by the device under test 300 to an expected value pattern. The test apparatus 200 of the present modification is provided with a signal generating apparatus 100, a pattern generating section 110, a judging section 120, and a transmission path 140.

The pattern generating section 110 generates a test pattern for testing the device under test 300. For example, the pattern generating section 110 generates a test pattern that includes a logic pattern, i.e. pattern data, to be included in the test signal input to the device under test 300.

The signal generating apparatus 100 generates the test signal input to the device under test 300 based on the test pattern generated by the pattern generating section 110. For example, the signal generating apparatus 100 generates a test signal that indicates a level corresponding to pattern data included in the test pattern. The signal generating apparatus 100 corrects, in advance, the waveform of the test signal. The operation and configuration of the signal generating apparatus 100 is described in detail further below.

The transmission path 140 sends the test signal output by the amplifier 130 to the input end of the device under test 300. The transmission path 140 may be a wire such as a cable. The transmission path 140 may cause a prescribed attenuation in the test signal or may cause the test signal to become a prescribed reflected wave.

The judging section 120 judges the acceptability of the device under test 300 based on the output signal from the device under test 300. For example, the judging section 120 judges the acceptability of the device under test 300 by comparing the logic pattern of the output signal to the expected value pattern supplied from the pattern generating section 110. The pattern generating section 110 generates the expected value pattern, which is based on the generated test pattern.

The signal generating apparatus 100 includes a timing generating section 10, a shift register section 20, a register section 40, and a waveform generating section. The waveform generating section of the present modification includes a first calculating section 50, a second calculating section 60, an output section 70, and an amplifier 130.

The timing generating section 10 includes a plurality of timing generators 12-1 to 12-n (referred to hereinafter collectively as the "timing generators 12") that generate a plurality of cyclical signals, which each have a different phase with respect to a reference clock, based on the reference clock supplied thereto. In other words, the plurality of timing generators 12 each have substantially the same cycle, and each generate a cyclical signal with a phase different from that of the other cyclical signals. Each timing generator 12 may be a PLL circuit. Instead, a single reference timing generator 12 may be a PLL circuit and the rest of the timing generators 12 may be delay circuits. In this case, the reference timing generator 12 generates a first cyclical signal, the first cyclical signal is branched and received by each of the other timing generators 12, and each of the other timing generators 12 delays the first cyclical signal by a different amount.

The shift register section 20 includes a plurality of flip-flops 22-1 to 22-m (referred to hereinafter collectively as the "flip-flops 22") in a cascade connection. The shift register section 20 sequentially propagates each piece of data in the pattern data output by the pattern generating section 110. Each flip-flop 22 receives the first cyclical signal output by the first timing generator 12-1, as the operation clock, and sequentially propagates each piece of data in the pattern data to a downstream flip-flop 22, according to the first cyclical signal.

The second calculating section 60 includes a plurality of sign-control circuits 62-1 to 62-m (referred to hereinafter collectively as the "sign control circuits 62") and a plurality of calculating circuits 64-1 to 64-m (referred to hereinafter collectively as the "calculating circuits 64"), both pluralities disposed to correspond one-to-one with the plurality of flip-flops 22. Each sign control circuit 62 determines the sign of the data value output by the corresponding flip-flop 22. In other words, each sign control circuit 62 selects whether the sign of the data value output by the corresponding flip-flop 22 is positive or negative, and outputs the data value with the selected sign. The sign selected by each sign control circuit 62 may be set in advance by a user. The sign selected by each sign control circuit 62 may be fixed during operation of the signal generating apparatus 100, or may be changeable during operation of the signal generating apparatus 100.

Each calculating circuit 64 receives the data value output by the corresponding flip-flop 22 via the corresponding sign control circuit 62. Each calculating circuit 64 outputs a signal having a level according to a result obtained by multiplying the received data value by a preset coefficient. Each calculating circuit 64 may be an amplifier circuit with an amplification rate corresponding to the above coefficient. The coefficient of each calculating circuit 64 may be fixed during operation of the signal generating apparatus 100, or may be changeable during operation of the signal generating apparatus 100.

The output section 70 adds together the waveforms of the signals output by the calculating circuits 64, and outputs the result. The amplifier 130 amplifies the test signal generated by the output section 70 by a prescribed amplification rate, and outputs the result. The amplifier 130 may output the test signal with a predetermined signal level as a reference level. For example, the amplifier 130 may amplify the test signal by a predetermined amplification rate, add the test signal to a predetermined offset voltage, and output the result. With this configuration, a correction can be made for the waveform of the output signal with the edges of the first cyclical signal as a reference, based on the pattern data.

The register section 40 includes a plurality of registers 42-1 to 42-m (referred to hereinafter collectively as the "registers 42") that are provided to correspond one-to-one with the plurality of timing generators 12-2 to 12-n, but not with the first timing generator 12-1. The registers 42 are in a cascade connection. In other words, the output data from each register 42 is input to the register 42 at the subsequent stage. Each register 42 acquires the input data according to the cyclical signal output by the corresponding timing generator 12, and outputs the acquired data. In the present modification, the first-stage register 42 receives data output by a single preselected flip-flop and sequentially propagates the data according to the cyclical signal output by the corresponding timing generator 12.

The first calculating section 50 includes a plurality of sign-control circuits 52-1 to 52-m (referred to hereinafter collectively as the "sign control circuits 52") and a plurality of calculating circuits 54-1 to 54-m (referred to hereinafter collectively as the "calculating circuits 54"), both pluralities disposed to correspond one-to-one with the plurality of registers 42. Each sign control circuit 52 determines the sign of the data value output by the corresponding register 42. In other words, each sign control circuit 52 selects whether the sign of the data value output by the corresponding register 42 is positive or negative, and outputs the data value with the selected sign. The sign selected by each sign control circuit 52 may be set in advance by a user. The sign selected by each sign control circuit 52 may be fixed during operation of the signal generating apparatus 100, or may be changeable during operation of the signal generating apparatus 100.

Each calculating circuit 54 receives the data value output by the corresponding register 42 via the corresponding sign control circuit 52. Each calculating circuit 54 outputs a signal having a level according to a result obtained by multiplying the received data value by a preset coefficient. Each calculating circuit 54 may be an amplifier circuit with an amplification rate corresponding to the above coefficient. The coefficient of each calculating circuit 54 may be fixed during operation of the signal generating apparatus 100, or may be changeable during operation of the signal generating apparatus 100.

The output section 70 adds together the waveforms of the signals output by the calculating circuits 54, and outputs the result. In other words, the output section 70 outputs a signal obtained by adding together the waveforms of the plurality of signals output by the calculating circuits 54 and the calculating circuits 64. With this configuration, a correction can be made for the waveform of the output signal with a timing different from the edges of the first cyclical signal as a reference, based on the pattern data.

The phases of the cyclical signals output by the timing generators 12 relative to the first cyclical signal may be set as desired by a user. In this way, the correction can be made for the waveform of the output signal with a desired timing as a reference. For example, when correcting a signal edge of the output signal, i.e. an edge timing of the first cyclical signal, a waveform can be generated corresponding to this signal edge at a different phase, i.e. the edge timing of a different cyclical signal. Therefore, even if a reflected wave occurs in the transmission path 140, a waveform that cancels out this reflected wave is already generated in the output signal. As a result, the desired signal can be accurately input to the device under test 300.

The tap control section 30 selects a data value output by a certain flip-flop 22 from among the plurality of flip-flops 22, and inputs the data value to the first-stage register 42. In this way, it is possible to select which flip-flop 22 outputs the data value to be used as the reference when correcting the waveform. The user can set in advance which flip-flop 22 the tap control section 30 selects.

The tap control section 30 inputs to each sign control circuit 62 the data value output by the corresponding flip-flop 22. A user may set in advance which flip-flop 22 corresponds to which sign control circuit 62. The setting of the tap control section 30 may be fixed during operation of the signal generating apparatus 100.

Figure 10:
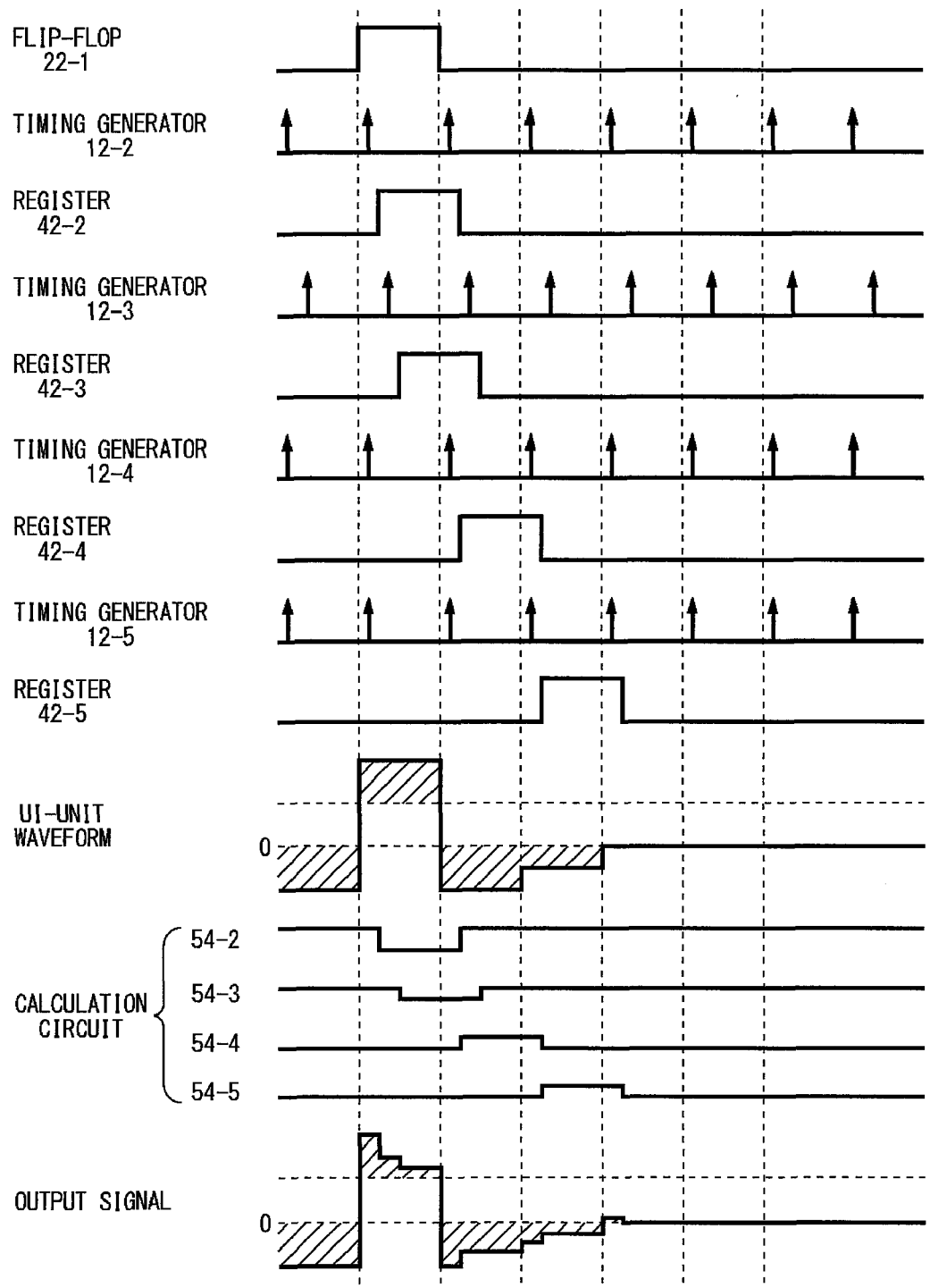
FIG. 10 is a timing chart showing an exemplary operation of the signal generating apparatus 100.

FIG. 10 is a timing chart showing an exemplary operation of the signal generating apparatus 100. FIG. 10 mainly describes waveform correction by the first calculating section 50, and describes a case where five timing generators are provided. In this example, the tap control section 30 selects the data output by the flip-flop 22-1 to be input to the first-stage register 42-2.

The flip-flop 22-1 sequentially propagates the data values output by the pattern generating section 110, according to the first cyclical signal. As shown in FIG. 10, when the flip-flop 22-1 outputs a data value of 1, the register 42-2 acquires the data value of 1 according to a second cyclical signal output by the corresponding timing generator 12-2, and outputs the acquired data value. In the same way, each register 42 at a later stage acquires the data output by the register 42 at an earlier stage according to the cyclical signal output by the corresponding timing generator 12, and outputs the acquired data.

Each calculating circuit 54 outputs a signal according to the data value output by the corresponding register 42, as shown in FIG. 10. As described above, each calculating circuit 54 outputs a signal having a level obtained by multiplying (i) the data value output by the corresponding register 42 by (ii) a preset coefficient. Each sign control circuit 52 determines the sign of the signal output by the corresponding calculating circuit 54.

The output section 70 adds together the waveforms output by the calculating circuits 54 to correct the waveform of the output signal. At this time, the output section 70 may further add the waveform at unit interval (UI) units generated by the second calculating section 60. The generation of the waveform at UI units is a conventional technique, and therefore no description is provided. The unit interval may refer to a period of time that a single bit lasts in the test signal.

In FIG. 10, the dotted lines indicate regions corrected by the first calculating section 50 and the second calculating section 60. Being able to correct the waveform of the output signal based on a plurality of cyclical signals having different phases, as shown in FIG. 10, enables correction with a high degree of freedom.

As described above, the signal generating apparatus 100 of the present embodiment can perform waveform correction with single UI units of the output signal as references, based on the pattern data of the output signal, and can also perform waveform correction of the output signal at any desired timing. In this way, the signal generating apparatus 100 can accurately correct the waveform of the output signal to enable accurate testing of the device under test 300.

Figure 11A:
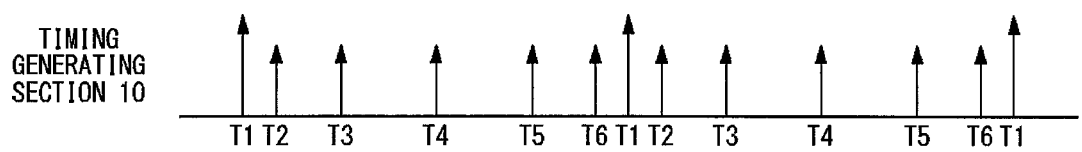
FIG. 11A shows another example of edge timings of the plurality of cyclical signals.

FIG. 11 shows another example of edge timings of the plurality of cyclical signals. The timing generating section 10 may output the cyclical signals such that the distribution of edge timings of the cyclical signals output by the plurality of timing generators 12 other than the first timing generator 12-1 becomes denser when these edge timings are closer to the edge timings of the first cyclical signal output by the first timing generator 12-1, as shown in FIG. 11A. In this case, finer correction can be performed near the signal edges of the output signal.

Figure 11B:
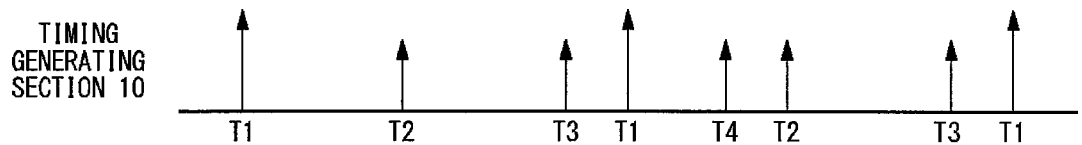
FIG. 11B shows more examples of edge timings of the plurality of cyclical signals.

The timing generating section 10 may set the phase difference between the first cyclical signal and the cyclical signal output by a certain timing generator 12 to be greater than 1 UI (unit interval of the first cyclical signal), as shown in FIG. 11B. In this case, a waveform can be generated in advance that cancels out the reflected wave occurring at a phase separated from the pulse of the output signal by more than 1 UI. The cycle of each cyclical signal may be substantially equal to the cycle of the test signal, i.e. 1 UI.

Figure 12:
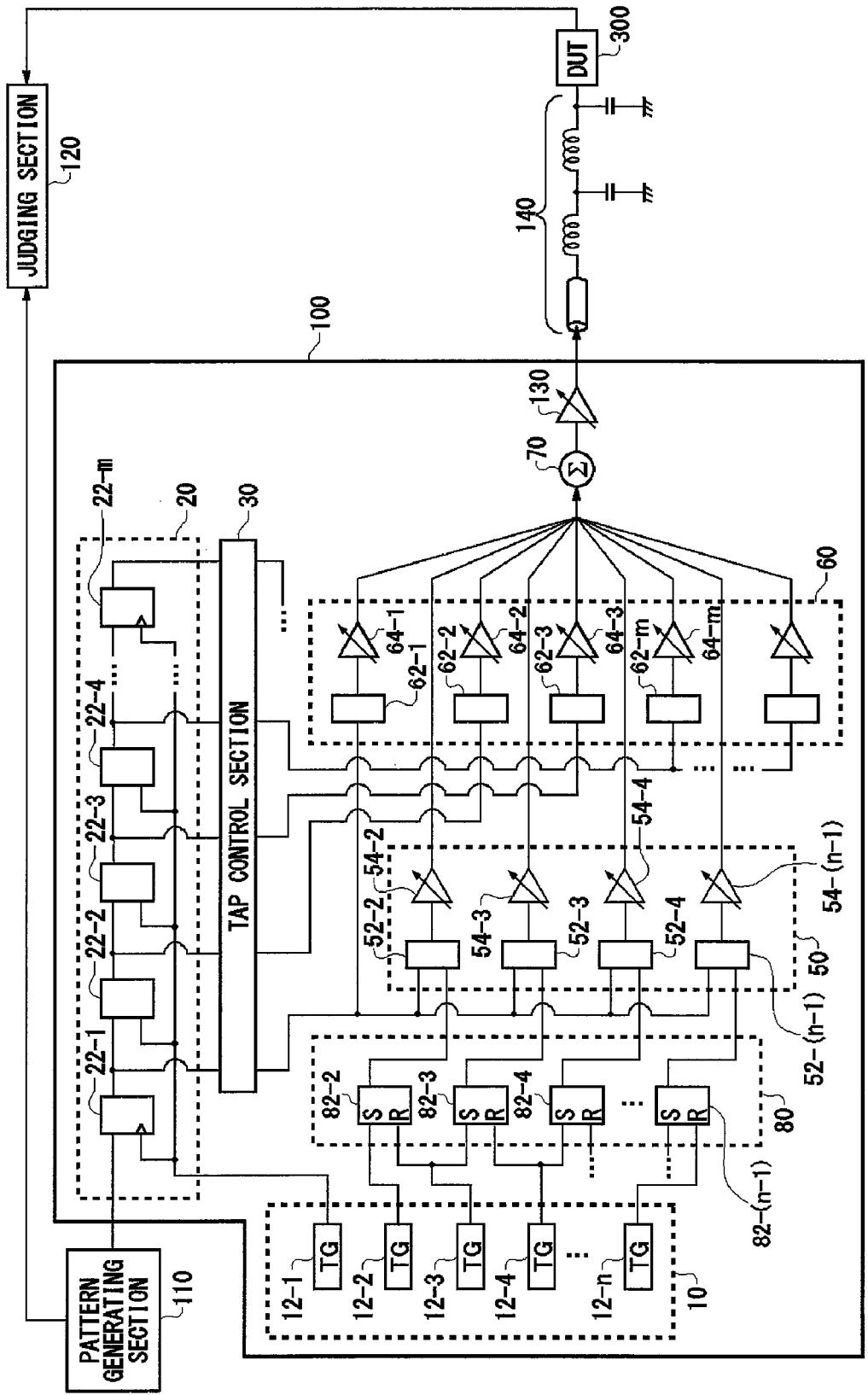
FIG. 12 shows another exemplary configuration of the signal generating apparatus 100.

FIG. 12 shows another exemplary configuration of the signal generating apparatus 100. The signal generating apparatus 100 of the present example has the same configuration as the signal generating apparatus 100 shown in FIG. 9, except that instead of a register section 40, the signal generating apparatus 100 of the present example has a set-reset latch section 80. Other components are the same as those of the signal generating apparatus 100 shown in FIG. 9, and therefore further description is omitted.

The set-reset latch section 80 includes a plurality of set-reset latches 82-2 to 82-(n−1) (referred to hereinafter collectively as the "set-reset latches 82") provided to correspond one-to-one with the timing generators 12-2 to 12-(n−1), but not with the first timing generator 12-1 and the final-stage timing generator 12-n. Each set-reset latch 82 receives a cyclical signal from both the corresponding timing generator 12 and the timing generator 12 at the next stage after the corresponding timing generator 12. The timing generator 12 at the next stage may refer to the timing generator 12 that (i) outputs a cyclical signal having a phase delayed by the cyclical signal output by the corresponding timing generator 12 and (ii) outputs a cyclical signal having a phase that is nearest the phase of the cyclical signal output by the corresponding timing generator 12.

Each set-reset latch 82 outputs a signal that indicates a logic value of 1 during a period between (i) the edge of the cyclical signal received from the corresponding timing generator 12 and (ii) the edge of the cyclical signal received from the timing generator 12 at the next stage. The tap control section 30 inputs to the sign control circuits 52 the data value output by the selected flip-flop 22. Each sign control circuit 52 determines the sign of the received data value when the corresponding set-reset latch 82 outputs a logic value of 1, and outputs the determined sign.

The signal generating apparatus 100 of the present example can correct the waveform of the output signal at a desired timing corresponding to the edges of the cyclical signals, and can correct the waveform of the output signal at a desired pulse width corresponding to the phase difference of each cyclical signal. For example, the signal generating apparatus 100 can perform an extremely fine waveform correction by significantly decreasing the phase difference between the cyclical signals output by two timing generators 12.

Figure 13:
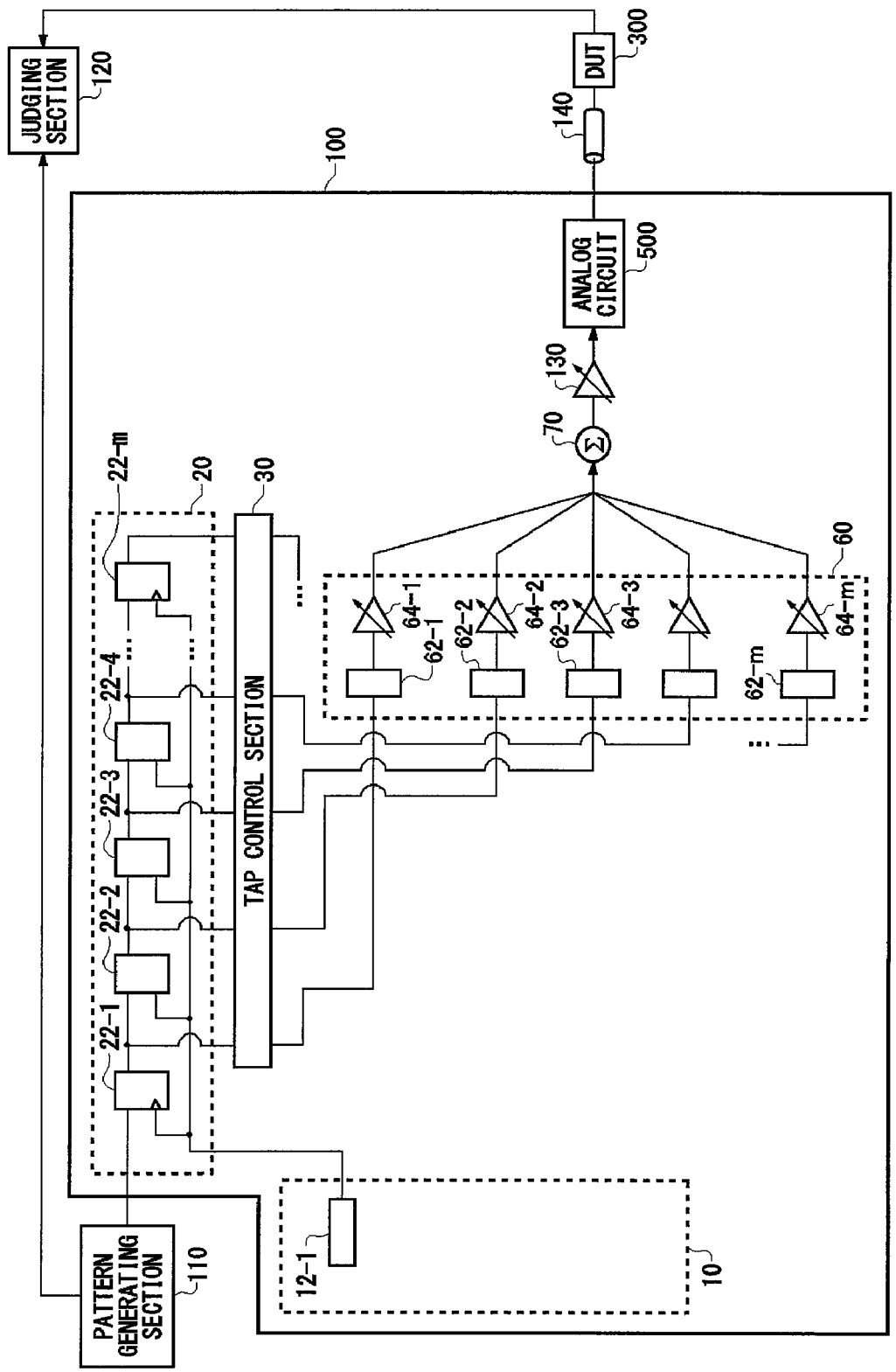
FIG. 13 shows another exemplary configuration of the signal generating apparatus 100.

FIG. 13 shows another exemplary configuration of the signal generating apparatus 100. The signal generating apparatus 100 of the present example generates a continuous waveform by emphasizing a prescribed frequency component in a discrete waveform obtained by combining rectangular waveforms, such as the waveforms shown in FIG. 10. For example, the signal generating apparatus 100 may emphasize the waveform in UI units, as shown in FIG. 10, or may emphasize a prescribed frequency component of the output signal. In the latter case, the signal generating apparatus 100 shown in FIG. 9 or FIG. 12 may be further provided with an analog circuit 500 that is located downstream from the amplifier 130 and that emphasizes the prescribed frequency component of the waveform output by the amplifier 130. The analog circuit 500 may be an analog peaking circuit that emphasizes a prescribed high-frequency component. The analog circuit 500 may emphasize the high-frequency component by superimposing a differential waveform of the input waveform or the like onto the input waveform. The analog circuit 500 may smooth the input waveform. With this configuration, the signal generating apparatus 100 can convert the discrete waveform of the output signal shown in FIG. 10 into a continuous waveform in which the prescribed frequency component is emphasized.

FIG. 13 describes an exemplary configuration of the signal generating apparatus 100 when emphasizing the waveform in UI units shown in FIG. 10. The signal generating apparatus 100 of the present example has the same basic configuration as the signal generating apparatus 100 shown in FIG. 9, but the register section 40 and the first calculating section 50 are removed and the analog circuit 500 is included. The timing generating section 10 of the present example also differs from the timing generating section 10 of FIG. 9 in that this timing generating section 10 has only one timing generator 12-1. Other components are the same as those of the signal generating apparatus 100 shown in FIG. 9, and therefore further description is omitted.

The shift register section 20 sequentially propagates each piece of data in the pattern data to the plurality of flip-flops 22, according to the cyclical signal generated by the timing generator 12-1. For example, the timing generator 12-1 may generate the cyclical signal to have a cycle substantially equal to the cycle of the test signal to be generated, i.e. 1 UI. The tap control section 30 of the present example may have the same function and configuration as the tap control section 30 described in FIG. 9 or FIG. 12.

The waveform generating section of the present example includes the second calculating section 60, the output section 70, and the amplifier 130. The waveform generating section generates an output signal having a value that changes at each cycle of the cyclical signal generated by the timing generator 12-1, based on the data values output by the flip-flops 22 in the shift register section 20. Since the signal generating apparatus 100 of the present example does not include the register section 40 and the first calculating section 50, the waveform of the output signal from the amplifier 130 corresponds to the waveform in UI units shown in FIG. 10, for example.

The analog circuit 500 emphasizes the prescribed frequency component in the waveform of the output signal generated by the amplifier 130 of the waveform generating section, and inputs the resulting waveform to the device under test 300 via the transmission path 140. For example, the analog circuit 500 may be an analog peaking circuit that emphasizes a predetermined high-frequency component to emphasize the edge portions of the output signal. The analog circuit 500 may be provided in parallel with an RC high-pass filter in the transmission path, as described below in FIG. 18, and may generate a waveform in which the predetermined high-frequency component is emphasized by combining the signals of the RC high-pass filter and the transmission path. The time constant of the analog circuit 500 may be determined according to the time constant of the transmission path 140, which can be measured in advance.

Figure 14:
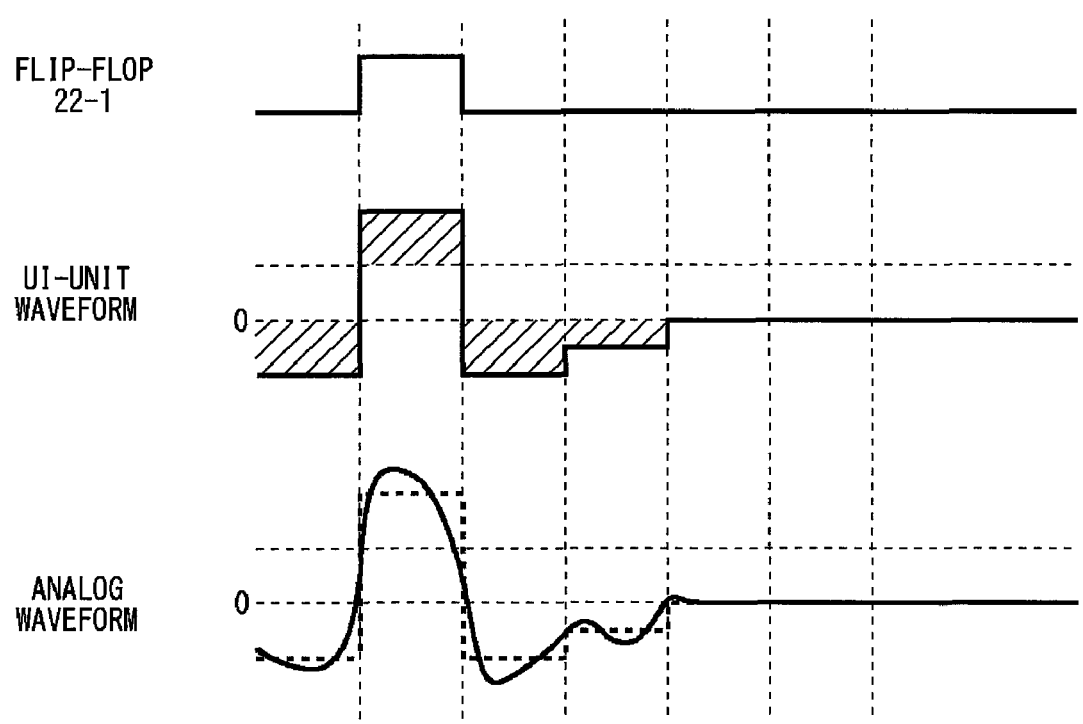
FIG. 14 shows exemplary analog waveforms output by the analog circuit 500.

FIG. 14 shows exemplary analog waveforms output by the analog circuit 500. As described above, the analog circuit 500 is supplied with a discrete waveform in UI units, and generates an analog waveform in which the high-frequency component is emphasized. The signal generating apparatus 100 of the present example uses the simple configuration shown in FIG. 13 to generate a test signal having a value that changes in units smaller than 1 UI, as shown in FIG. 14.

Figure 15:
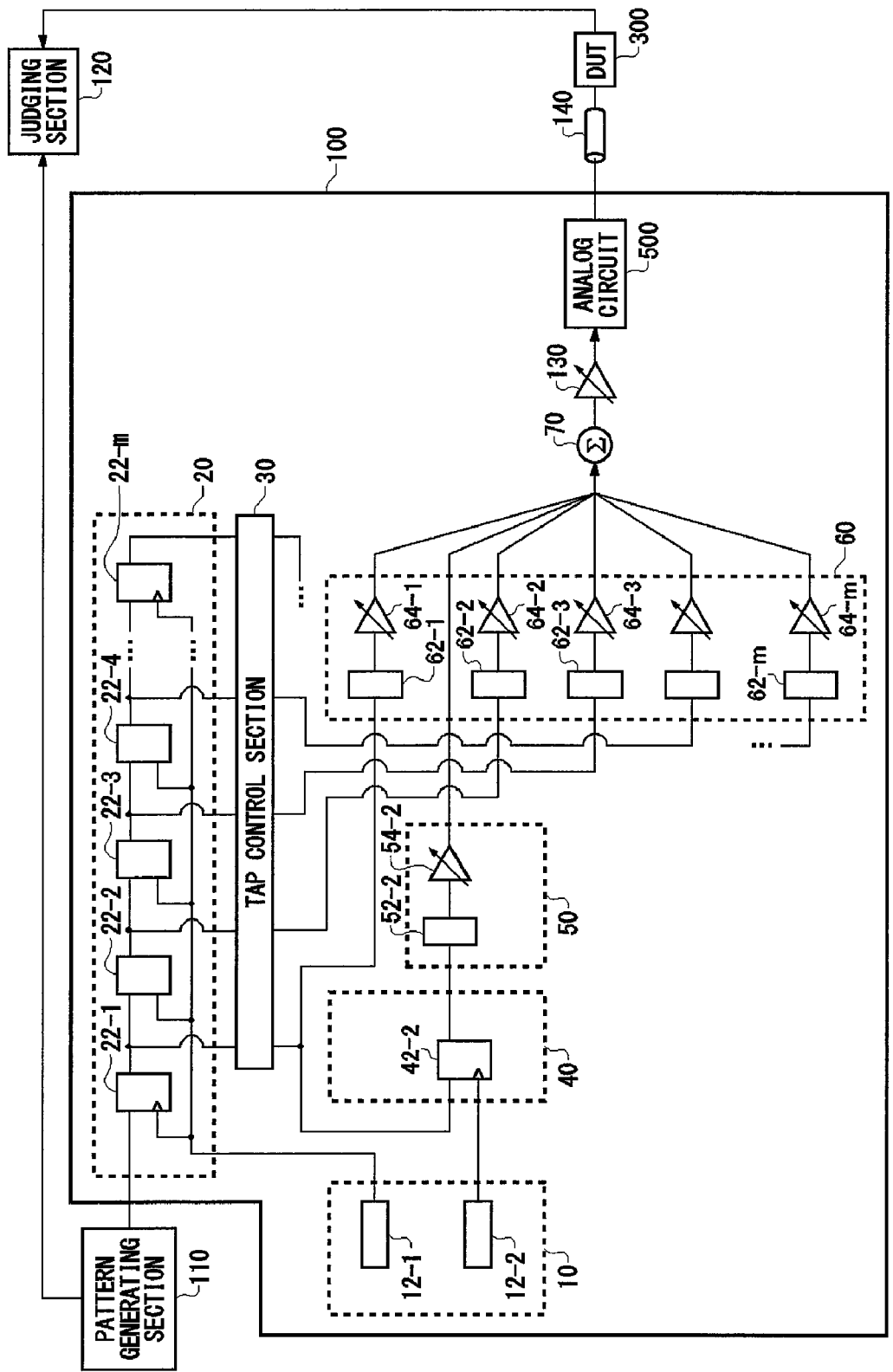
FIG. 15 shows another exemplary configuration of the signal generating apparatus 100.

FIG. 15 shows another exemplary configuration of the signal generating apparatus 100. The signal generating apparatus 100 of the present example has the same configuration as the signal generating apparatus 100 shown in FIG. 9, but is further provided with the analog circuit 500. Furthermore, the timing generating section 10 includes the first timing generator 12-1 and the second timing generator 12-2, and register section 40 includes a single register 42-2, and the first calculating section 50 includes a single sign control circuit 52-2 and a single calculating circuit 54-2. Other components are the same as those of the signal generating apparatus 100 shown in FIG. 9, and therefore further description is omitted.

The second timing generator 12-2 may generate a second cyclical signal having a phase that differs from that of the first cyclical signal generated by the first timing generator 12-1. The second cyclical signal and the first cyclical signal may have substantially the same cycle. The register 42-2 sequentially acquires the data output by the single flip-flop 22 selected in advance by the tap control section 30, according to the second cyclical signal received from the second timing generator 12-2.

The waveform generating section of the present example includes the first calculating section 50, the second calculating section 60, the output section 70, and the amplifier 130. The waveform generating section generates an output signal having a value that changes according to a phase of the first cyclical signal and a phase of the second cyclical signal, based on the data values output by the flip-flops 22 and the registers 24.

More specifically, the sign control circuit 52-2 and the calculating circuit 54-2 in the first calculating section 50 generate a waveform having a value that changes according to the phase of the second cyclical signal, based on the data values output by the register 24. The second calculating section 60 generates a waveform having a value that changes according to the phase of the first cyclical signal output by the data values output by the flip-flops 22. The output section 70 combines the waveforms output by the first calculating section 50 and the second calculating section 60 to generate the output signal having a value that changes according to a phase of the first cyclical signal and a phase of the second cyclical signal.

The amplifier 130 and the analog circuit 500 may have the same function and configuration as the amplifier 130 and the analog circuit 500 shown in FIG. 13. This configuration enables more accurate correction of the waveform of the test signal. For example, the signal generating apparatus 100 can generate a waveform in which a reflected wave or the like occurring at a certain timing differing from the edges of the first cyclical signal is compensated for.

In this case, the tap control section 30 may select the flip-flop 22 to be connected to the register 42-2 according to which unit interval includes the reflection of a square wave in a certain unit interval. By selecting a flip-flop 22, the tap control section 30 can select a unit interval for generating the waveform to compensate for the reflected wave. The phase in the selected unit interval at which the waveform compensating for the reflected wave is generated can be adjusted by the phase of the second cyclical signal generated by the second timing generator 12-2. The second timing generator 12-2 may generate the second cyclical signal to have a phase difference, relative to the first cyclical signal, that corresponds to the phase at which the waveform compensating for the reflected wave is to be generated.

Figure 16:
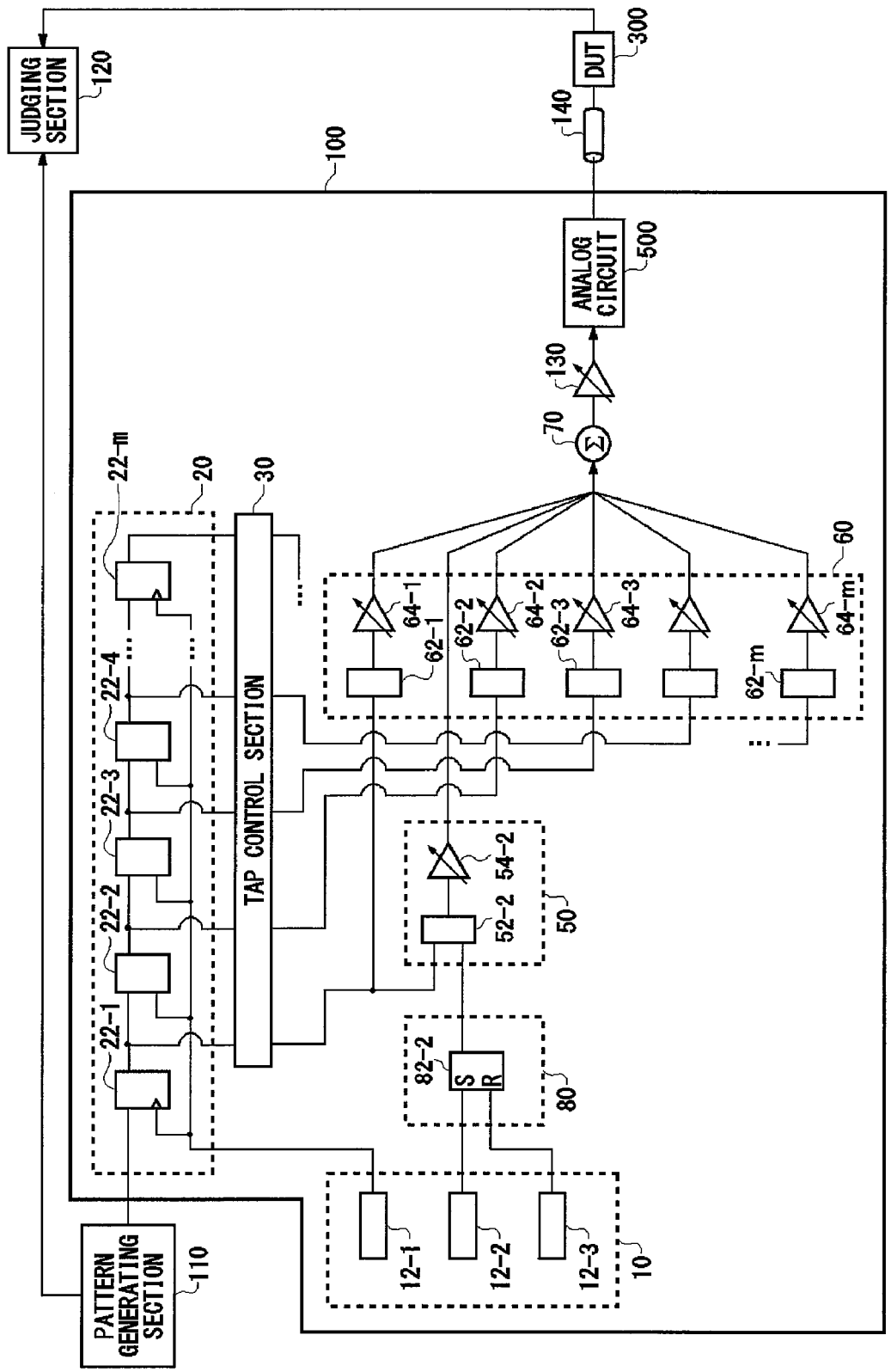
FIG. 16 shows another exemplary configuration of the signal generating apparatus 100.

FIG. 16 shows another exemplary configuration of the signal generating apparatus 100. The signal generating apparatus 100 of the present example has the same configuration as the signal generating apparatus 100 at shown in FIG. 15, except that the signal generating apparatus 100 of the present invention is provided with the set-reset latch section 80 instead of the register section 40. The set-reset latch section 80 includes a single set-reset latch 82, as described in FIG. 12. The timing generating section 10 further includes a third timing generator 12-3. Other components are the same as those of the signal generating apparatus 100 shown in FIG. 15, and therefore further description is omitted.

The third timing generator 12-3 generates a third cyclical signal. The third cyclical signal may have a phase different from that of the second cyclical signal. The set-reset latch 82 receives the second cyclical signal and the third cyclical signal, and outputs a pulse having a pulse width corresponding to the phase difference between the second cyclical signal and the third cyclical signal, as described in FIG. 12.

As described in FIG. 12, the sign control circuit 52-2 determines the sign of the logic value supplied from the tap control section 30, and outputs the sign while the signal received from the set-reset latch 82 is logic H. The processes performed by the calculating circuit 54 and onward may be the same as the processes of the signal generating apparatus 100 described in FIG. 15.

With this configuration, the signal generating apparatus 100 can generate a waveform in which the reflected wave or the like is compensated for with a pulse width that differs from the cycle of each cyclical signal. In other words, the signal generating apparatus 100 can generate a waveform in which a reflected wave or the like with any pulse width is compensated for by adjusting the phase difference between the second cyclical signal and the third cyclical signal.

Figure 17:
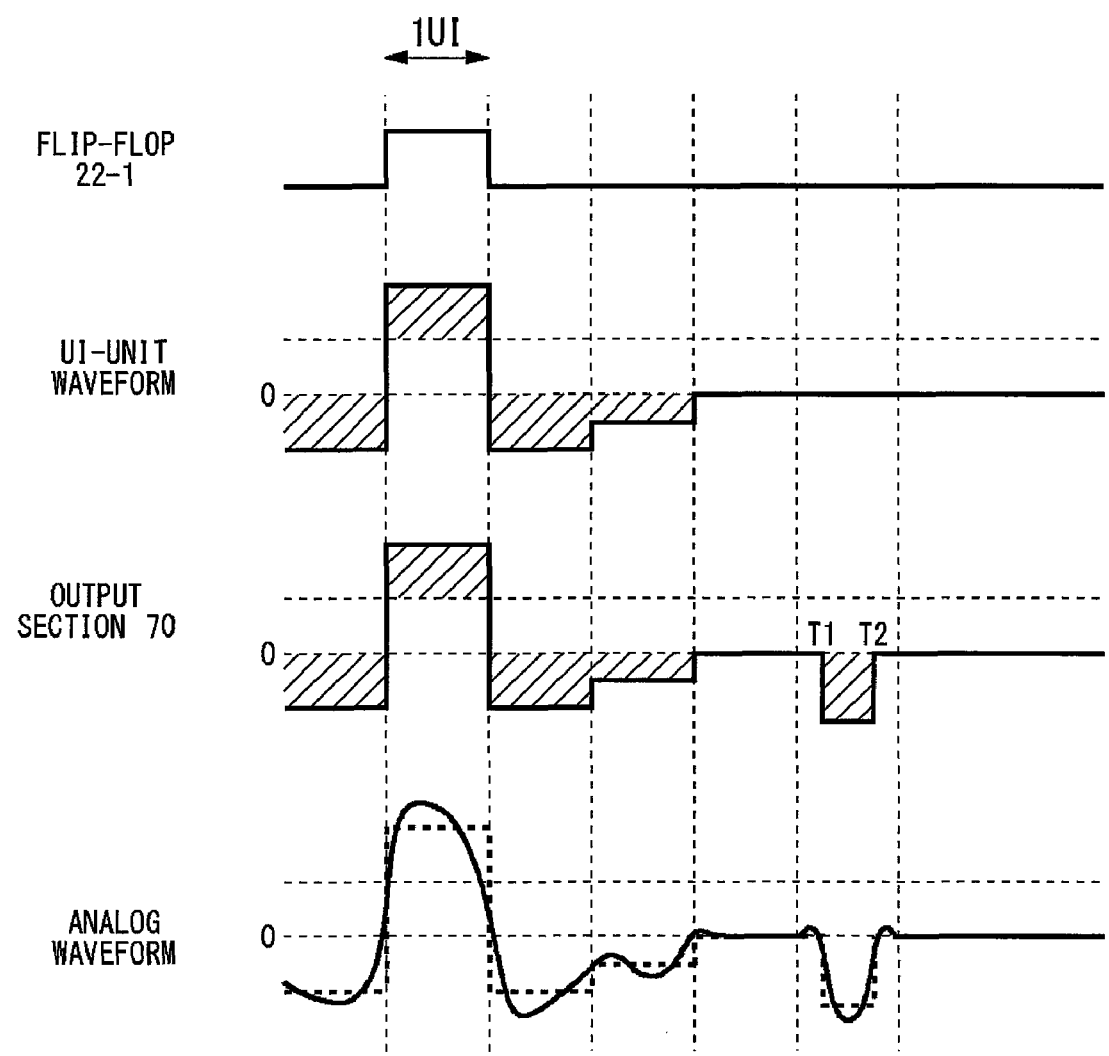
FIG. 17 shows an exemplary operation of the signal generating apparatus 100 described in FIG. 16.

FIG. 17 shows an exemplary operation of the signal generating apparatus 100 described in FIG. 16. In FIG. 17, T1 represents the phase of the first cyclical signal and T2 represents the phase of the second cyclical signal, for example. As described above, the signal generating apparatus 100 can generate a waveform in which a pulse with a certain pulse width is set at a certain position by adjusting the phase difference between the first cyclical signal and the second cyclical signal. In this way, the signal generating apparatus 100 can compensate for a reflected wave or the like with any pulse width occurring at any location.

Figure 18:
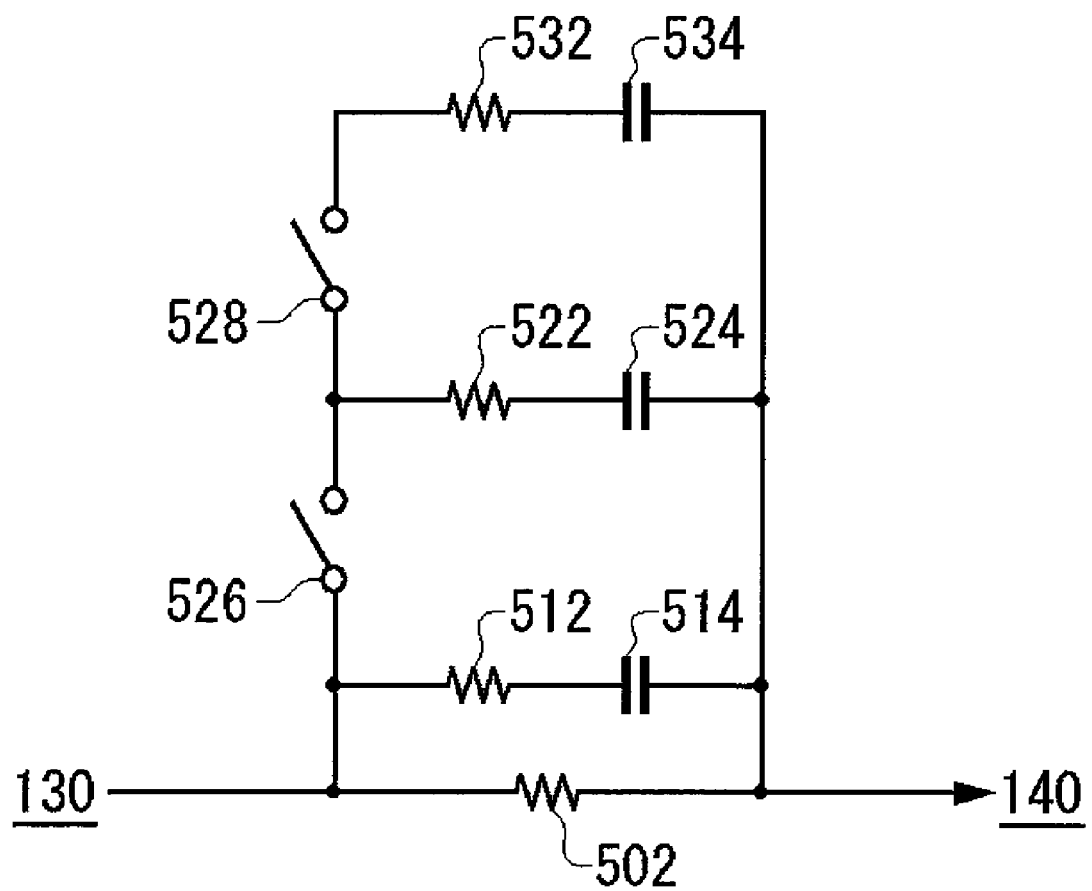
FIG. 18 shows an exemplary configuration of the analog circuit 500.

FIG. 18 shows an exemplary configuration of the analog circuit 500. The analog circuit 500 includes a plurality of resistors 502, 512, 522, and 532, a plurality of capacitors 514, 524, and 534, and a plurality of switches 526 and 528. The resistors 502, 512, 522, and 532 are provided in parallel. The capacitors 514, 524, and 534 are provided to correspond one-to-one with the resistors 512, 522, and 532 in the transmission path, and are each connected serially to the corresponding resistor. The switch 526 switches whether the resistors and capacitors from the second stage onward are connected in parallel with the resistor 502 in the signal path.

For example, when the switch 526 is off, the analog circuit 500 generates a waveform by superimposing a signal passed through a one-stage CR high-pass FIR filter onto the original signal. When all of the switches are on, the analog circuit 500 generates a waveform by superimposing a signal passed through a three-stage CR high-pass FIR filter onto the original signal. The constants for the resistors and capacitors may be adjusted according to the time constant to be set. With this configuration, a waveform can be generated in which a prescribed high-frequency component of the input signal is emphasized. The configuration of the analog circuit 500 is not limited to the configuration shown in FIG. 18. Any known high-frequency component emphasizing circuit can be used as the analog circuit 500.

Figure 19:
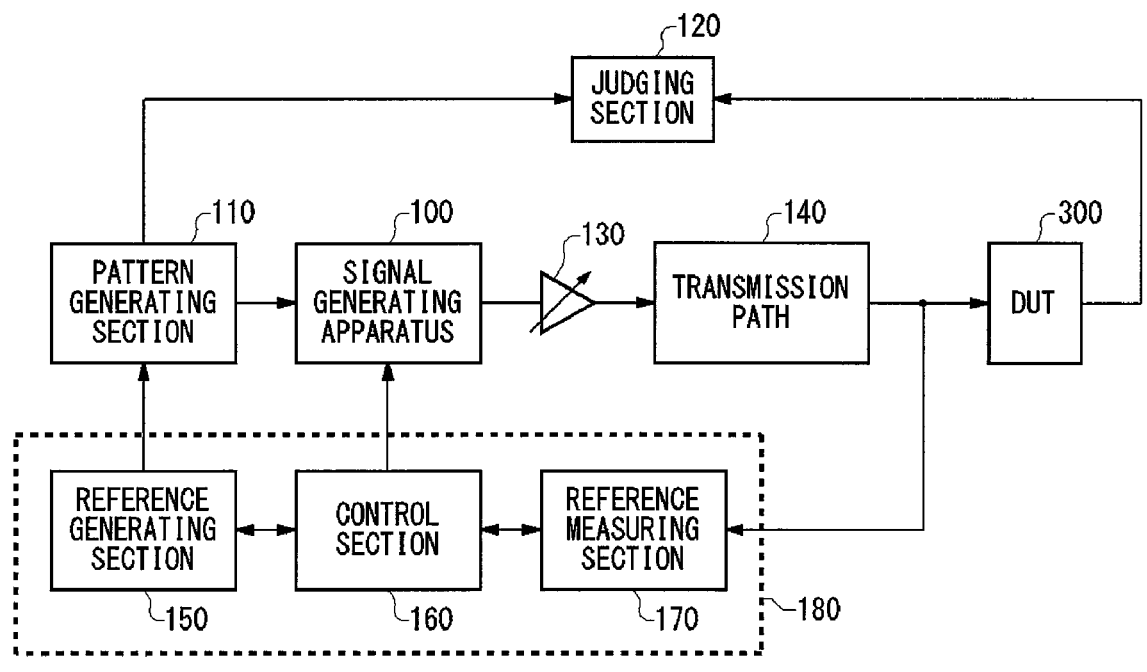
FIG. 19 shows another exemplary configuration of the test apparatus 200.

FIG. 19 shows another exemplary configuration of the test apparatus 200. The test apparatus 200 of the present example has the same configuration as the test apparatuses 200 described in FIGS. 9 to 18, but is further provided with a calibration section 180. Other components are the same as those of the test apparatuses 200 shown in FIGS. 9 to 18, and therefore further description is omitted.

The calibration section 180 calibrates the signal generating apparatus 100 before testing of the device under test 300. The calibration section 180 includes a reference generating section 150, a reference measuring section 170, and a control section 160.

The reference generating section 150 outputs a reference signal having a prescribed waveform to the signal generating apparatus 100. The reference generating section 150 of the present example causes the pattern generating section 110 to output prescribed pattern data.

The reference measuring section 170 measures the waveform of the reference signal transmitted to the input terminal of the device under test 300. The control section 160 sets the first calculating section 50 and the second calculating section 60 based on the waveform of the reference signal measured by the reference measuring section 170. For example, the control section 160 sets the signs for the sign control circuit 52 and the sign control circuit 62, and sets the weighting coefficients for the calculating circuit 54 and the calculating circuit 64. The control section 160 may also set the phase of the cyclical signals output by the timing generators 12.

Figure 20:
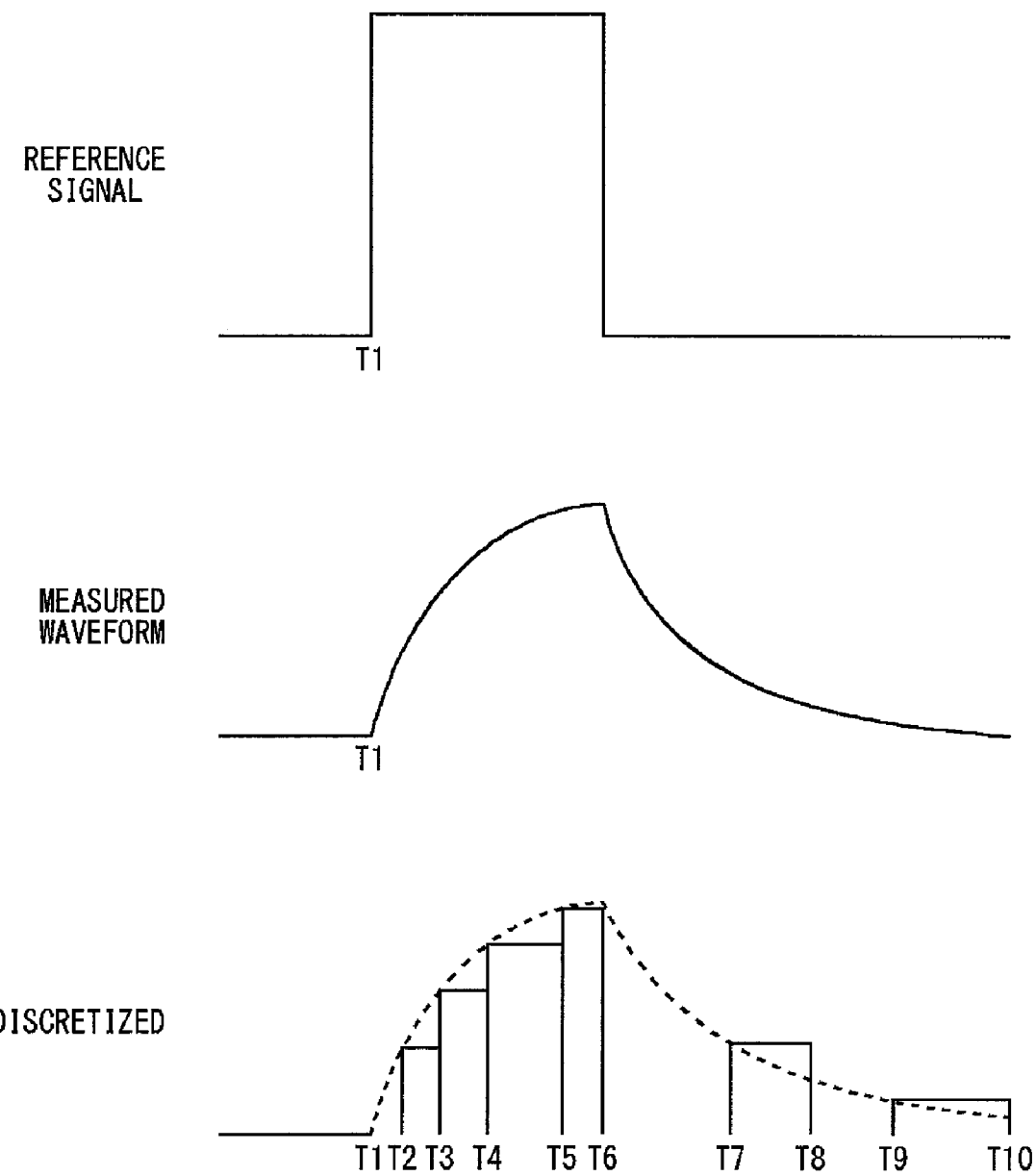
FIG. 20 shows an exemplary operation of the calibration section 180.

FIG. 20 shows an exemplary operation of the calibration section 180. As described above, the reference generating section 150 causes the signal generating apparatus 100 to output the prescribed reference signal. The reference measuring section 170 measures the waveform of the signal transmitted to the input terminal of the device under test 300. The control section 160 discretizes the waveform measured by the reference measuring section 170, as shown in FIG. 20. The control section 160 detects the attenuation or the like of the reference signal in the transmission path 140 based on the discretized measured waveform, and calibrates the signal generating apparatus 100 based on the detection result.

For example, the control section 160 approximates the measured waveform using a plurality of pulses. The control section 160 may then control the phases of the cyclical signals output by the timing generators 12, based on the pulse width and phase of each pulse. The control section 160 may control the weighting coefficients in the calculating circuit 54 and the calculating circuit 64 based on the levels of the rectangular waves. The control section 160 may compare the waveform of the reference signal to the discretized measured waveform to determine whether to superimpose the rectangular wave components of the measured waveform onto the reference signal or to subtract the rectangular wave components of the measured waveform from the reference signal. The control section 160 may control the signs for the sign control circuit 52 and the sign control circuit 62 based on the determination result.

In FIGS. 9 to 20, the waveform of the output signal was corrected to compensate in advance for attenuation, reflection, or the like in the transmission path 140, but the function of the signal generating apparatus 100 is not limited to this. For example, the signal generating apparatus 100 may deteriorate the waveform of the output signal and input the deteriorated waveform to the device under test 300. In this way, it is possible to test the degree of waveform degradation that is acceptable for the device under test 300 to still operate correctly.

Figure 21:
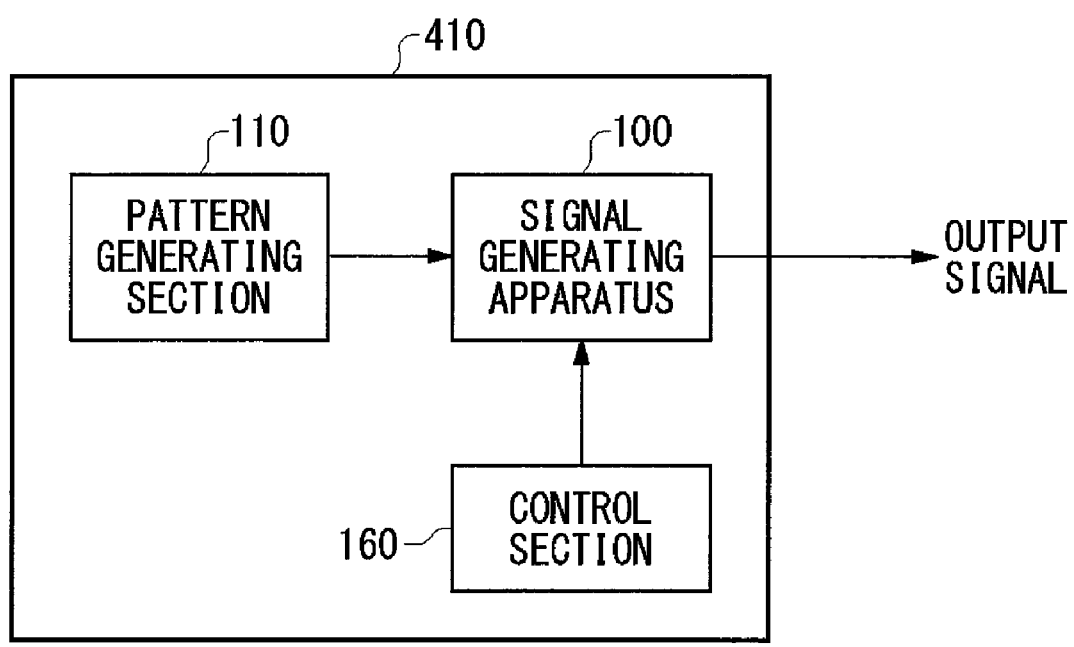
FIG. 21 shows an exemplary configuration of a circuit device 400 according to an embodiment of the present invention.

FIG. 21 shows an exemplary configuration of a circuit device 400 according to an embodiment of the present invention. The circuit device 400 may include a semiconductor circuit or the like. The circuit device 400 is provided with a substrate 410, the pattern generating section 110, the signal generating apparatus 100, and the control section 160. The substrate 410 is a semiconductor substrate or the like. The pattern generating section 110, the signal generating apparatus 100, and the control section 160 may be circuits formed on the substrate 410.

Components of the pattern generating section 110, the signal generating apparatus 100, and the control section 160 that are the same as those described in FIGS. 9 to 20 are given the same reference numerals, and further description is omitted. The control section 160 of the present embodiment may receive in advance information concerning the phases of the cyclical signals, the weighting coefficients, and the signs to be set in the signal generating apparatus 100. The control section 160 may set the signal generating apparatus 100 based on setting data received from the outside. With this configuration, the circuit device 400 can output a signal having a desired waveform.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a comparator that is electrically connected to a terminal of the device under test, and that detects a logic value of a response signal from the device under test;
    a correction signal generating section that generates a correction signal for correcting attenuation of the response signal occurring while the response signal travels from the terminal of the device under test to the comparator;

a driver that supplies the generated correction signal to the comparator;

an expected value pattern generator that generates an expected value pattern corresponding to a test pattern for testing the device under test; and a judging section that judges whether the logic value of the response signal detected by the comparator matches an expected value of the expected value pattern, wherein the correction signal generating section generates the correction signal based on the expected value pattern, the correction signal generating section generates the correction signal based on the correction pattern, which is obtained by delaying the expectation value pattern by one bit and inverting the delayed expectation value pattern, and the driver outputs the correction signal to have an amplitude smaller than an amplitude of the response signal.

2. A test apparatus that tests a device under test, comprising:

a comparator that is electrically connected to a terminal of the device under test, and that detects a logic value of a response signal from the device under test;

a correction signal generating section that generates a correction signal for correcting attenuation of the response signal occurring while the response signal travels from the terminal of the device under test to the comparator;

a driver that supplies the generated correction signal to the comparator;

an expected value pattern generator that generates an expected value pattern corresponding to a test pattern for testing the device under test; and a judging section that judges whether the logic value of the response signal detected by the comparator matches an expected value of the expected value pattern, and judges acceptability of the device under test based on a result of said judging whether the logic value matches the expected value, wherein the correction signal generating section generates the correction signal based on the expected value pattern.

3. The test apparatus according to claim 2, wherein
the correction signal is differentiated and the differentiated correction signal is supplied to the comparator.

4. The test apparatus according to claim 2, wherein
when the logic value of the response signal output by the device under test is different from the expected value of the expected value pattern, the correction signal generating section generates the correction signal to have an amplitude within a range that does not cause the comparator to erroneously detect that the received response signal has a logic value that matches the expected value of the expected value pattern.

5. The test apparatus according to claim 2, further comprising:

a test head that includes the correction signal generating section, the driver, and the comparator; and a device interface section that provides a connection between (i) the driver and the comparator and (ii) the terminal of the device under test, using a signal line.

6. The test apparatus according to claim 5, further comprising:

a cable serial resistor disposed at an end of the signal line on a side of the driver and the comparator;

a driver serial resistor disposed between (i) an end of the cable serial resistor on a side of the driver and the comparator and (ii) the driver; and a comparator serial resistor disposed between (iii) the end of the cable serial resistor on the side of the driver and the comparator and (iv) the comparator.

7. A method for manufacturing a device, comprising:
manufacturing the device; and
testing the device, using a test apparatus that tests a device under test, the test apparatus comprising:

a comparator that is electrically connected to a terminal of the device under test, and that detects a logic value of a response signal from the device under test;

a correction signal generating section that generates a correction signal for correcting attenuation of the response signal occurring while the response signal travels from the terminal of the device under test to the comparator;

a driver that supplies the generated correction signal to the comparator;

an expected value pattern generator that generates an expected value pattern corresponding to a test pattern for testing the device under test; and a judging section that judges whether the logic value of the response signal detected by the comparator matches an expected value of the expected value pattern, and judges acceptability of the device under test based on a result of said judging whether the logic value matches the expected value, wherein the correction signal generating section generates the correction signal based on the expected value pattern, the method further comprising:

selecting the device based on the acceptability judged by the judging section.

* * * * *